United States Patent
Cheng et al.

(10) Patent No.: US 11,594,676 B2
(45) Date of Patent: *Feb. 28, 2023

(54) RESISTIVE RANDOM-ACCESS MEMORY

(71) Applicant: International Business Machines Corporation, Armonk, NY (US)

(72) Inventors: Kangguo Cheng, Schenectady, NY (US); Choonghyun Lee, Rensselaer, NY (US); Juntao Li, Cohoes, NY (US); Peng Xu, Santa Clara, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 217 days.

This patent is subject to a terminal disclaimer.

(21) Appl. No.: 17/136,733

(22) Filed: Dec. 29, 2020

(65) Prior Publication Data

US 2021/0151670 A1 May 20, 2021

Related U.S. Application Data

(62) Division of application No. 16/835,843, filed on Mar. 31, 2020, now Pat. No. 10,985,315, which is a division of application No. 16/170,888, filed on Oct. 25, 2018, now Pat. No. 10,651,378.

(51) Int. Cl.
*H01L 45/00* (2006.01)
*H01L 27/24* (2006.01)

(52) U.S. Cl.
CPC ...... *H01L 45/1206* (2013.01); *H01L 27/2454* (2013.01); *H01L 45/1233* (2013.01); *H01L 45/16* (2013.01)

(58) Field of Classification Search
CPC . H01L 45/1206; H01L 45/16; H01L 45/1233; H01L 27/2454
USPC .............................................. 257/2
See application file for complete search history.

(56) References Cited

U.S. PATENT DOCUMENTS

| | | | |
|---|---|---|---|
| 7,116,577 B2 | 10/2006 | Eitan | |
| 8,617,952 B2 | 12/2013 | Kim et al. | |
| 8,773,881 B2 | 7/2014 | Shepard | |
| 9,099,385 B2 | 8/2015 | Petti | |
| 9,178,000 B1 | 11/2015 | Nardi et al. | |
| 10,121,827 B1 | 11/2018 | Lin et al. | |

(Continued)

OTHER PUBLICATIONS

Chang et al., "Physical mechanism of Hf02-based bipolar resistive random access memory," International Symposium on VLSI Technology, Systems and Applications (VLSI-TSA), 2011, 2 pages.

(Continued)

*Primary Examiner* — Caleen O Sullivan
(74) *Attorney, Agent, or Firm* — Amin, Turocy & Watson, LLP

(57) ABSTRACT

Techniques for fabricating a volatile memory structure having a transistor and a memory component is described. The volatile memory structure comprises the memory component formed on a substrate, wherein a first shape comprising one or more pointed edges is formed on a first surface of the memory component. The volatile memory structure further comprises transistor formed on the substrate and electrically coupled to the memory component to share operating voltage, wherein operating voltage applied to the transistor flows to the memory component.

20 Claims, 19 Drawing Sheets

(56) References Cited

U.S. PATENT DOCUMENTS

| | | |
|---|---|---|
| 10,269,868 B1 | 4/2019 | Yang et al. |
| 10,283,564 B1 | 5/2019 | Liu et al. |
| 10,651,378 B1 * | 5/2020 | Cheng ................. H01L 27/2454 |
| 10,985,315 B2 * | 4/2021 | Cheng ................. H01L 45/1233 |
| 2013/0270508 A1 | 10/2013 | Li et al. |
| 2014/0284679 A1 | 9/2014 | Ohba |

OTHER PUBLICATIONS

Pan et al., "1Kbit FinFET Dielectric (FIND) RRAM in pure 16nm FinFET CMOS logic process," International Electron Devices Meeting {IEDM), 2015, 4 pages.

Chien et al., "A forming-free WOx resistive memory using a novel self-aligned field enhancement feature with Excellent reliability and scalability," International Electron Devices Meeting {IEDM), 2010, 4 pages.

Fang et al., "Fully CMOS-compatible 1T1R integration of vertical nanopillar GAA transistor and oxide-based RRAM cell for high-density nonvolatile memory application," IEEE Transactions on Electron Devices, vol. 60, No. 3, Mar. 2013, pp. 1108-1113, 6 pages.

Non-Final Office Action received for U.S. Appl. No. 16/170,888 dated Oct. 4, 2019, 19 pages.

Office Action for U.S. Appl. No. 16/835,843 dated Sep. 4, 2020, 20 pages.

List of IBM Patents or Patent Applications Treated as Related.

* cited by examiner

RESISTIVE RANDOM-ACCESS MEMORY

BACKGROUND

The subject disclosure relates generally to a memory device and, more particularly, to a resistive non-volatile random-access memory.

SUMMARY

The following presents a summary to provide a basic understanding of one or more embodiments of the invention. This summary is not intended to identify key or critical elements, delineate scope of the embodiments or scope of the claims. Its sole purpose is to present concepts in a simplified form as a prelude to the more detailed description that is presented later. In one or more embodiments is described herein, systems, methods, apparatus and/or computer program products that facilitate fabrication of the resistive non-volatile random-access memory are described.

According to an embodiment, a device is provided that can comprise a memory component formed on a substrate, where a first shape comprising one or more pointed edges is formed on a first surface of the memory component. The device can further comprise a transistor formed on the substrate and electrically coupled to the memory component to share operating voltage, wherein operating voltage applied to the transistor flows to the memory component.

According to another embodiment, a method can comprise forming a memory component on a substrate, where a first shape comprises one or more pointed edges is formed on a first surface of the memory component. The method can further comprise forming a transistor on the substrate and electrically coupled to the memory component to share operating voltage, wherein operating voltage applied to the transistor flows to the memory component.

According to another embodiment, a method can comprise forming a transistor and a memory component on a substrate. The method can further comprise forming a source region at a bottom portion of the memory component and the transistor, wherein the memory component, the bottom portion of the transistor, and the source region comprising a first material that electrically couples the memory component and the transistor, wherein operating voltage applied to the transistor flows to the memory component.

DETAILED DESCRIPTION

Figure 1:
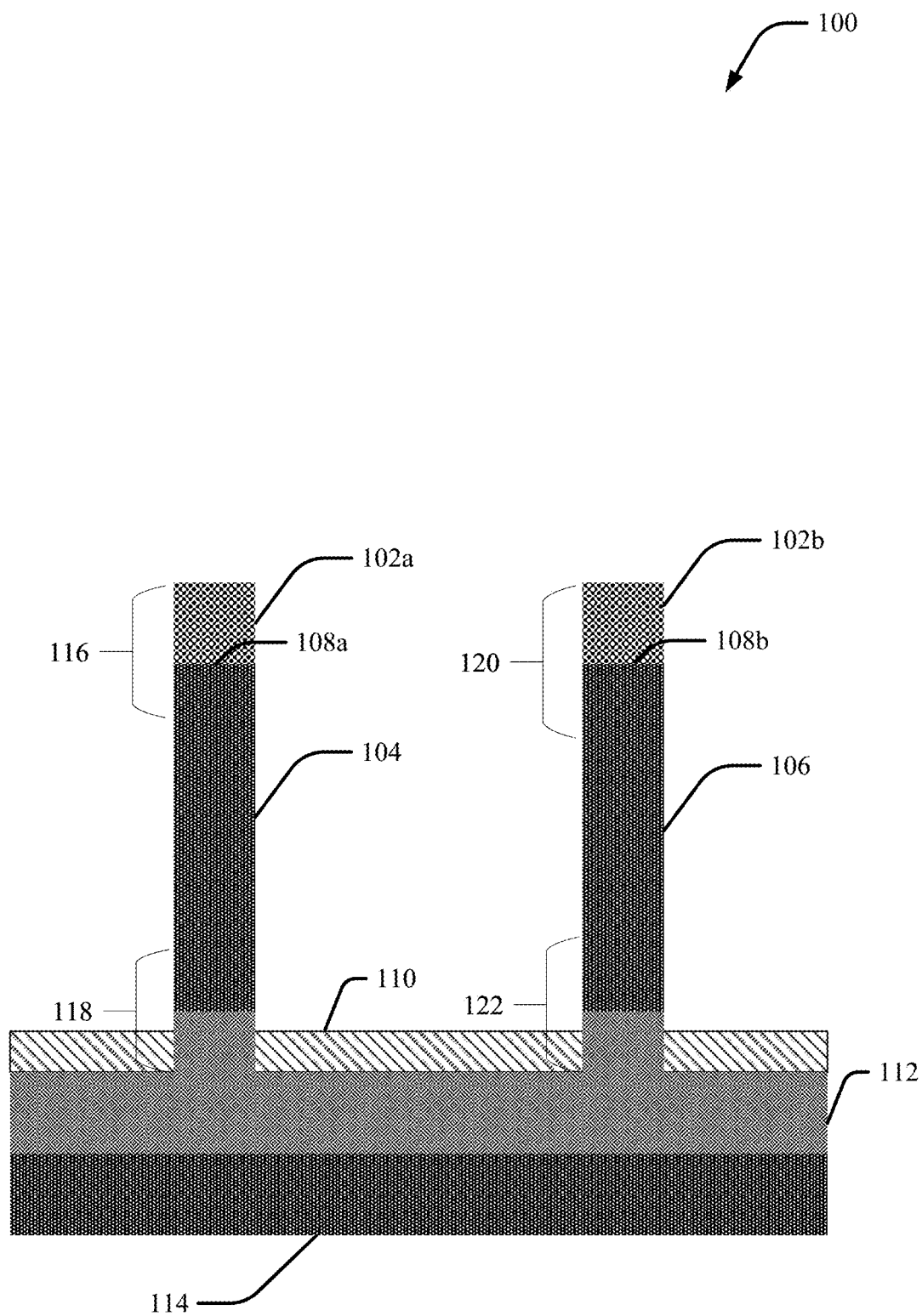
FIG. 1 illustrates an example, non-limiting starting structure for fabricating a resistive non-volatile memory structure in accordance with one or more embodiments is described herein.

The following detailed description is merely illustrative and is not intended to limit embodiments and/or applications or uses of embodiments. Furthermore, there is no intention to be bound by any expressed or implied information presented in the preceding Summary section, or in the Detailed Description section.

As used herein, unless otherwise specified, terms such as "on," "overlying," "atop," "on top," "positioned on," or "positioned atop" mean that a first element is present on a second element, wherein intervening elements may be present between the first element and the second element. As used herein, unless otherwise specified, the term directly used in connection with the terms "on," "overlying," "atop," "on top," "positioned on," or "positioned atop" "contacting," "directly contacting," or the term "direct contact," mean that a first element and a second element are connected without any intervening elements, such as, for example, "intermediary conducting," "insulating" or "semiconductor layers," present between the "first element" and the "second element." As used herein, terms such as "upper," "lower,"

"above," "below," "directly above," "directly below," "aligned with," "adjacent to," "right," "left," "vertical," "horizontal," "top," "bottom," and derivatives thereof shall relate to the disclosed structures as oriented in the drawing figures. The terminology used herein is for describing embodiments and is not intended to be limiting of the inventive concept. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. It is to be understood that when an element is referred to as being "connected" or "coupled" to another element, it may be directly connected or coupled to the other element or intervening elements may be present. In contrast, when an element is referred to as being "directly connected" or "directly coupled" to another element, there are no other intervening elements present.

Spatially relative terms, such as "beneath," "below," "around," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below.

It is to be understood that the various layers and/or regions shown in the accompanying drawings may not be drawn to scale, and that one or more layers and/or regions of a type commonly used transistors, fins, and/or other semiconductor devices may not be explicitly shown in a given drawing. This does not imply that the layers and/or regions not explicitly shown are omitted from the actual transistor devices. In addition, certain elements may be left out of views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures may not be repeated for each of the drawings.

Resistive random-access memory (e.g., also referred to as ReRAM or RRAM) Is becoming preferred non-volatile random-access memory. A non-volatile random-access memory structure is described below that integrates ReRAM with a transistor to share operating voltage. Each structure can have a transistor component and a resistive component. Both transistor and resistive components have fin-like structure. In some embodiments described herein, the resistive component comprises one or more sharp edges formed at a first surface of the resistive component to reduce that operating voltage required to program the ReRAM. Various techniques, including but not limited to, faceted etching or oxidization process can be used to create the sharp edges. In some embodiments, the operating voltage is applied to the transistor component, which is shared with the resistive component.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident; however, in various cases, that the one or more embodiments can be practiced without these specific details.

FIGS. 1-6 respectively illustrate intermediate semiconductor structures formed in association with an example fabrication process for forming a resistive non-volatile memory structure 100 in accordance with some embodiments described herein. In this regard, the respective FIGS. 1-6 pictorially demonstrate a sequential flow of respective fabrication steps of the example fabrication process. Repetitive description of like elements shown in respective embodiments are omitted for sake of brevity.

FIG. 1 illustrates an example, non-limiting starting structure for fabricating the resistive non-volatile memory structure 100 in accordance with one or more embodiments is described herein. Repetitive description and label of like elements employed in respective embodiments are omitted for sake of brevity. According to one or more embodiments, the resistive non-volatile memory structure 100 comprises a substrate 114, a transistor (a vertical field-effect transistor, e.g., VFET) 104 and a memory component (e.g., ReRAM) 106, both having a fin-like shape that extend upwardly from the substrate 114. Both transistor 104 and the memory component 106 can include a bottom source/drain region 112 formed at the bottom portions 118 and 122 of the transistor 104 and the memory component 106, respectively. The bottom source/drain region 112 is formed over the substrate 114 and a bottom spacer layer 110 is formed over the bottom source/drain region 112.

In some embodiments, the substrate 114 is made using a semiconductor material, for example silicon (Si). Other suitable materials may also be used for the substrate 114 (also referred to as "semiconductor substrate"), for example, but not limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or another like semiconductor. III-V compound semiconductors may have a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). II-VI compound semiconductors may have a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). In addition, multiple layers of the semiconductor materials can be used as the semiconductor material of the substrate 114. In some embodiments, the substrate 114 includes both semiconductor materials and dielectric materials. The semiconductor substrate 114 may also comprise an organic semiconductor or a layered semiconductor such as, for example, Si/SiGe, a silicon-on-insulator or a SiGe-on-insulator. In some embodiments, a portion or entire semiconductor substrate 114 may be amorphous, polycrystalline, or monocrystalline. In some embodiments, the semiconductor substrate 114 employed may comprise a hybrid oriented (HOT) semiconductor substrate 114 in which the HOT substrate 114 has surface regions of different crystallographic orientation. The semiconductor substrate 114 may be doped, undoped or contain doped regions and undoped regions therein. The semiconductor substrate 114 may contain regions with strain and regions without strain therein or contain regions of tensile strain and compressive strain. In some embodiments, the substrate 114 includes other device structures (not shown) such as transistors, isolation structures (such as shallow trench isolations), contacts, conducting wires, etc.

In some embodiments, the starting structure, the transistor 104 and the memory component 106 can be composed of the same material used for the substrate 114. For example, the transistor 104 and the memory component 106 can comprise, but not limited to, silicon, silicon germanium, silicon germanium carbide, silicon carbide, gallium arsenide, polysilicon, epitaxial silicon, amorphous silicon, or combination thereof. The transistor 104 and the memory component 106 each comprising a top surface 108a and 108b, respectively. The transistor 104 and the memory component 106 are provided with a hard mask 102a and 102b at a top portion 116 and 120, respectively. The hard mask 102a and 102b may comprise, but not limited to, an insulating layer such as silicon oxide, silicon nitride, silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), a low dielectric constant material, or other suitable insulator material.

In some embodiments, the bottom source/drain region 112 can comprise a doped semiconductor material such as silicon, silicon germanium, germanium, or any other suitable materials. For example, the bottom source/drain region 112 can comprise, but not limited to, an in-situ doped (i.e., during epitaxy growth) epitaxial material such as in-situ doped epitaxial Si, carbon doped silicon (Si:C) and/or SiGe. Suitable n-type dopants can include, but are not limited to, phosphorous (P) and arsenic (As). Suitable p-type dopants can include, but are not limited to, boron (B), gallium (Ga). The use of an in-situ doping process is merely an example. For instance, one may instead employ an ex-situ process to introduce dopants into the source and drains. Other doping techniques can be used to incorporate dopants in the bottom source/drain region. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques. In some embodiments, the bottom spacer layer 110 can comprise dielectric material with high dielectric constant value (e.g., low K, wherein K is between 4-6). In some embodiments, the spacer material may comprise, but not limited to, silicon oxide, silicon nitride, silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), or any suitable combination of those materials.

Figure 2:
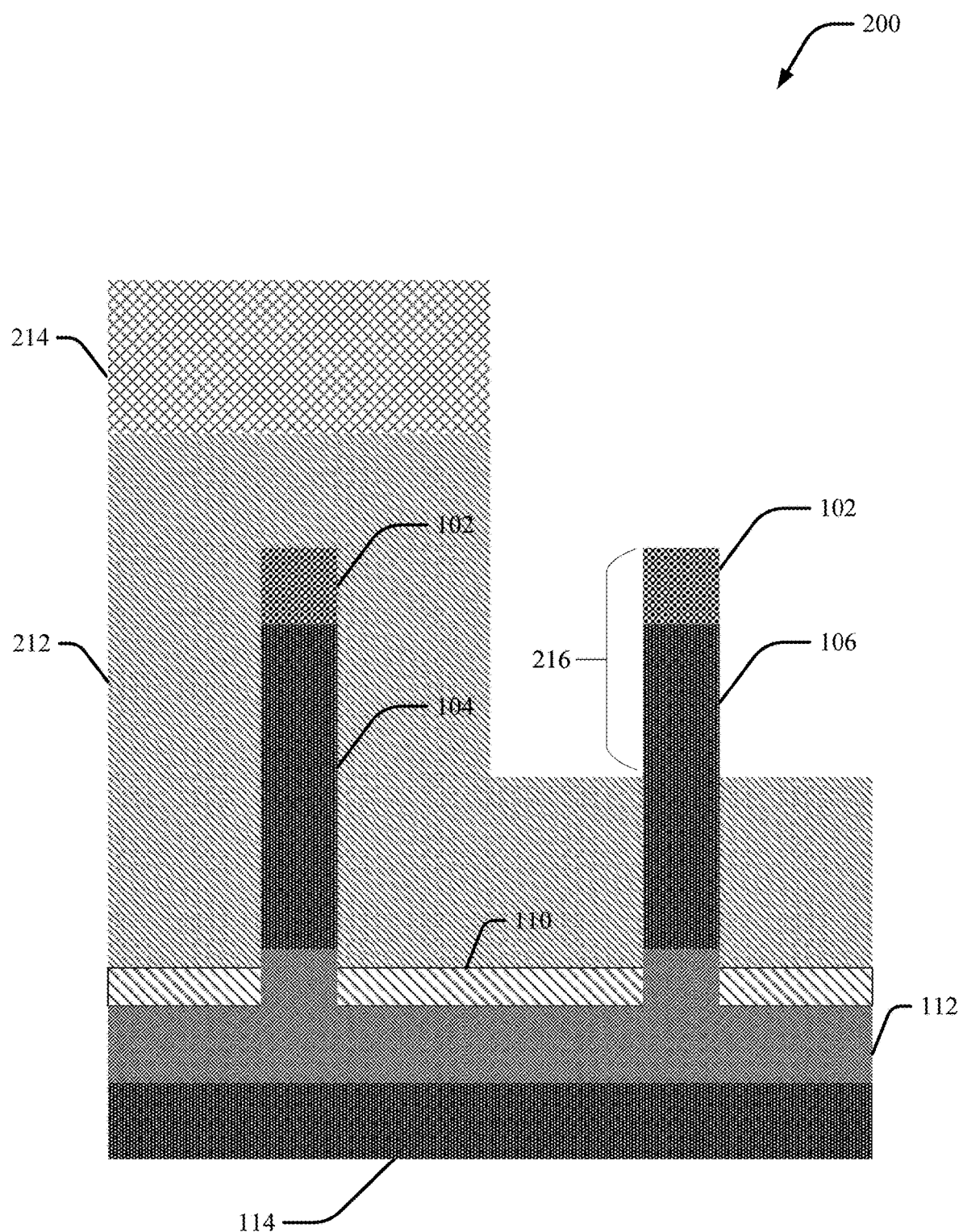
FIG. 2 illustrates an example, non-limiting step in fabricating the resistive non-volatile memory structure in accordance with one or more embodiments is described herein.

FIG. 2 illustrates an example, non-limiting step in fabricating the resistive non-volatile memory structure 200 in accordance with one or more embodiments is described herein. Repetitive description and label of like elements employed in respective embodiments are omitted for sake of brevity. According to one or more embodiments, an organic planarization layer (OPL) 212 is deposited, for example, by spin-on coating. The OPL layer 212 is to fill gaps between the transistor 104 and memory component 106 and to form a planar surface. A mask layer 214 is then used to protect the transistor 104 while OPL layer 212 formed around the memory component 106 is partially recessed, e.g., by reactive ion etch (RIE) to expose the top of the memory component 106. The mask layer 214 can be formed by spin-on coating followed by lithography. The OPL layer 212 can be used to protect the transistor 104 during further fabrication of the memory component 106. The recess depth of the OPL is not critical as long as the top portion of the memory component 106 is exposed. As depicted, a portion 216 of the memory component 106 remains exposed.

Figure 3:
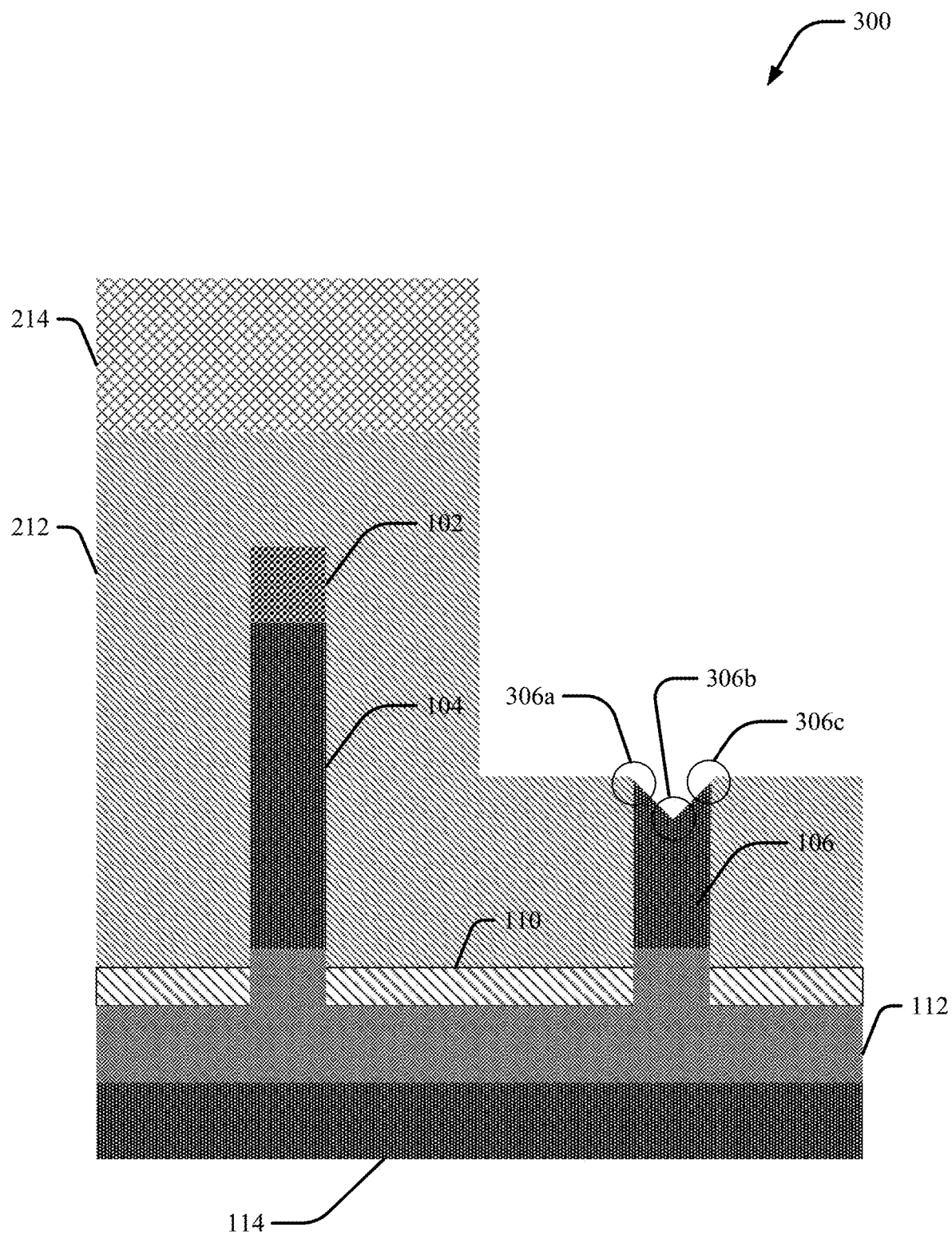
FIG. 3 illustrates an example, non-limiting step in fabricating the resistive non-volatile memory structure in accordance with one or more embodiments is described herein.

FIG. 3 illustrates an example, non-limiting step in fabricating the resistive non-volatile memory structure 300 in accordance with one or more embodiments is described herein. Repetitive description and label of like elements employed in respective embodiments are omitted for sake of brevity. According to one or more embodiments, the hard mask 102b covering the memory component 106 is removed using a suitable etching process. In some embodiments, a facet etching process can be used to shape the top portion of the memory component 106. In some embodiments, an etch process is used to form the "V" groove which can be a semiconductor wet etch process. Non-limiting examples of wet etch processes that can be used to form the "V" groove include potassium hydroxide (KOH), ammonium hydroxide (ammonia), tetramethylammonium hydroxide (TMAH), hydrazine, or ethylene diamine pyrocatechol (EDP), or any combination thereof. In some embodiments, an ammonia etch can be used to form the "V" groove. The ammonia etch is self-limiting, that will stop etching the semiconductor fin (e.g., the memory component 106) once the {111} crystalline planes are formed. A silicon faceted etch (e.g., ammonia or Tetramethylammonium hydroxide etch) can be used to create a {111} plane facet (e.g., "V" groove) on the top surface 108b of the memory component 106. In some embodiments, the faceted etch technique is employed to create a "V" shaped faceted edge (e.g., shaping the top surface 108b of the memory component 106 by making facet cuts to create a "V" groove in the memory component 106). In some embodiments, upon completion of the faceted etch technique, the "V" shaped groove/indentation is formed at the top of memory component 106 having three sharp edges 306a-c, wherein sharp edges 306a and 306c are pointed edges. The sharp edge enhances the local electric field, thereby reducing required programming voltage of the ReRAM. In some embodiments, upon completion of the faceted etch technique, a faceted edge can comprise a plurality of pointed edges on top surface 108b (e.g., first surface) of the memory component 106.

Figure 4:
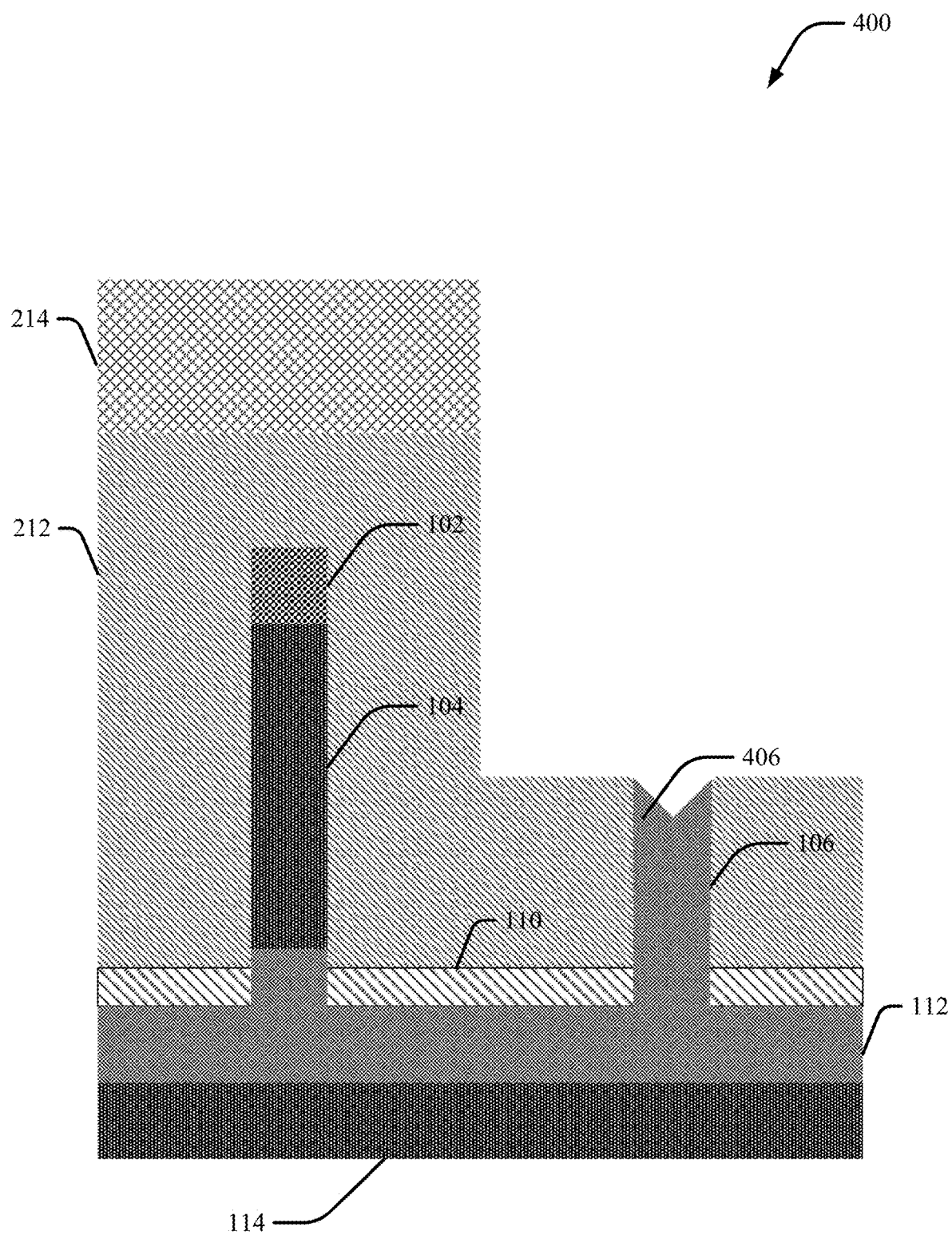
FIG. 4 illustrates an example, non-limiting step in fabricating the resistive non-volatile memory structure in accordance with one or more embodiments is described herein.

FIG. 4 illustrates an example, non-limiting step in fabricating the resistive non-volatile memory structure 400 in accordance with one or more embodiments is described herein. Repetitive description and label of like elements employed in respective embodiments are omitted for sake of brevity. According to one or more embodiments, the substrate-like material of the memory component 106 is removed and the memory component 106 is doped (e.g., implanting materials) with same material used for the bottom source/drain region 112. The doped memory component 106 can serve as bottom electrode of the ReRAM. In an embodiment, any suitable doping technique can be employed to dope the memory component 106. For example, ion implantation, gas phase doping, plasma doping, plasma immersion ion implantation, cluster doping, infusion doping, liquid phase doping, solid phase doping, or any suitable combination of those techniques comprise using, not limited to, material silicon, germanium, or silicon germanium, a n-type dopant can be selected from a group of phosphorus (P), arsenic (As) and antimony (Sb), and a p-type dopant can be selected from a group of boron (B), gallium (Ga), indium (In), and thallium (T).

Figure 5:
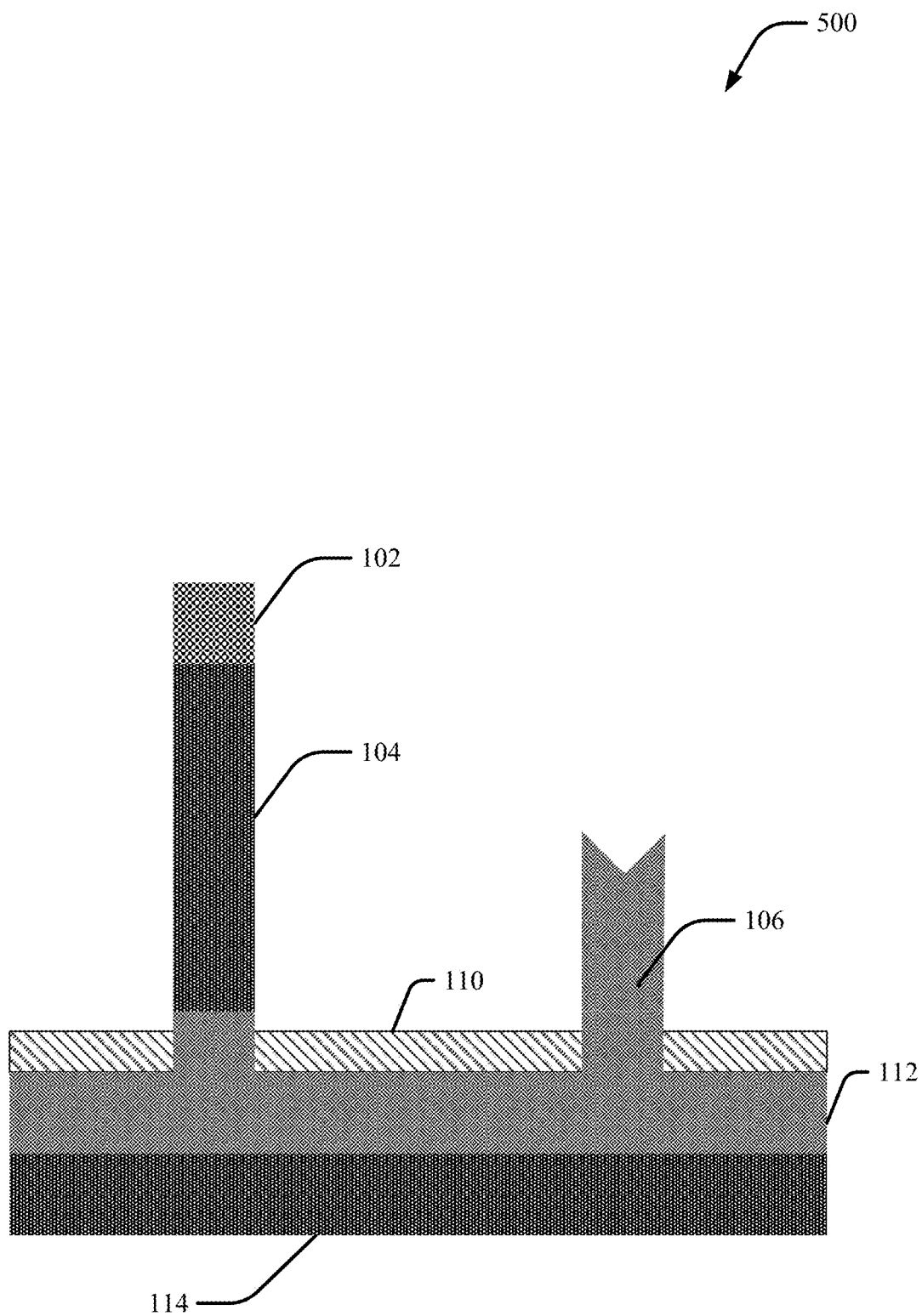
FIG. 5 illustrates an example, non-limiting step in fabricating the resistive non-volatile memory structure in accordance with one or more embodiments is described herein.

FIG. 5 illustrates an example, non-limiting step in fabricating the resistive non-volatile memory structure 500 in accordance with one or more embodiments is described herein. Repetitive description and label of like elements employed in respective embodiments are omitted for sake of brevity. According to one or more embodiments, the mask layer 214 and OPL 212 are removed using a suitable etching process such as plasma etch.

Figure 6:
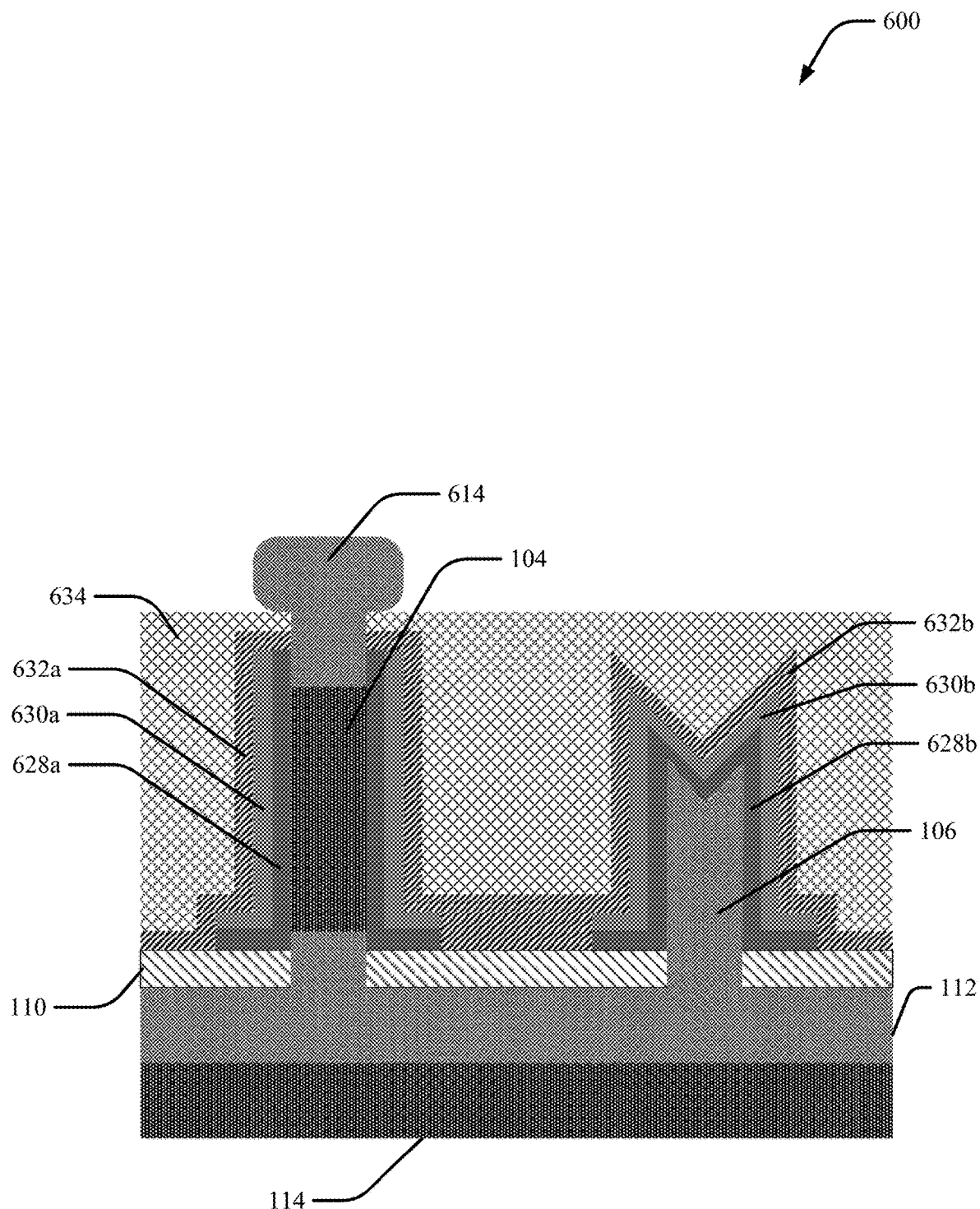
FIG. 6 illustrates an example, non-limiting step in fabricating the resistive non-volatile memory structure in accordance with one or more embodiments is described herein.

FIG. 6 illustrates an example, non-limiting step in fabricating the resistive non-volatile memory structure 600 in accordance with one or more embodiments is described herein. Repetitive description and label of like elements employed in respective embodiments are omitted for sake of brevity. According to one or more embodiments, a first dielectric layer 628a is formed over the transistor 104 such that a portion of the first dielectric layer 628a is electrically coupled to bottom source/drain region 112 at the bottom portion 118 of the transistor 104 and the bottom portion 122 of the memory component 106. In some embodiments, a second dielectric layer 628b is formed over the memory component 106 such that a portion of the second dielectric layer 628b is electrically coupled to bottom source/drain region 112 at the bottom portion of the memory component 106 and bottom portion of the transistor 104. In some embodiment a first metal gate layer 630a is formed over the first dielectric layer 628a and a second metal gate layer 630b is formed over the second dielectric layer 628b. In some embodiments, a first top spacer layer 632a is formed over the first metal gate layer 630a and a second top spacer layer 632b is formed over the second metal gate layer 630b. In some embodiments, an inter-level dielectric (ILD) 634 is deposited over both the transistor 104 and the memory component 106 and covering up to the top surface 108a of the transistor 104. Upon form the above layers, the hard mask 102a is removed and replaced with a top source/drain region 614. In an embodiment, the top source/drain region 614 is formed, for example, by epitaxy growth.

In some embodiments, the first and second dielectric layers 628a and the second 628b can comprise a high-x dielectric or transition metal oxide such as nickel oxide, tantalum oxide, titanium oxide, hafnium oxide, tungsten oxide, zirconium oxide, aluminum oxide, strontium titanate, and combinations thereof. The high-k dielectric can be deposited, for example, by conformal deposition processes include, but are not limited to, chemical vapor deposition (CVD), or atomic layer deposition (ALD).

In some embodiments, the first metal gate layer 630a and the second metal gate layer 630b can comprise any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO2), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material may further comprise dopants that are incorporated during or after deposition. In some embodiments, the metal gate layer 630a may comprise a work function setting layer (not shown) between the gate dielectric (e.g. first and second dielectric layer 628a and 628b) and gate conductor (e.g., first and second metal gate layer 630a and 630b). The work function setting layer can be a work function metal (WFM). The WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

In some embodiments, the first top spacer 632a and second top spacer 632b can comprise silicon nitride, silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), or any suitable combination of those materials.

In some embodiments, the top source/drain 614 can be formed from an in-situ doped (i.e., during growth) epitaxial material such as in-situ doped epitaxial Si, carbon doped silicon (Si:C) and/or SiGe. Suitable n-type dopants include but are not limited to phosphorous (P), and suitable p-type dopants include but are not limited to boron (B). The use of an in-situ doping process is merely an example. For instance, one may instead employ an ex-situ process to introduce dopants into the source and drains. In should be noted that other doping techniques can be used to incorporate dopants in the bottom source/drain region 112. Dopant techniques can include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques. In some embodiments, the high-k dielectric (e.g., second dielectric layer 628b) can serve as a memristor element sandwiched between two electrodes (e.g., the second metal gate layer 630b and the memory component 106). To render the memory component 106 (e.g., resistive memory element) functional, defects (e.g., oxygen vacancies) are intentionally introduced in the memristor film by applying a voltage across the second dielectric layer 628b. Different states such as a low-resistance state (logic "1") or a high-resistance state (logic "0") can be achieved by changing the polarity of electrical field across the second dielectric layer 628b.

In some embodiments, electrical contacts (not shown) can be formed on the top source/drain 614, on first metal gate layer 630a of the transistor 104, and on top of second dielectric layer 630b of the memory component 106, can be formed by any suitable processing such as deposition, patterning, metallization.

The advantage of fabricating the resistive non-volatile memory structure 600 wherein the top source/drain region 614 is electrically coupled, through the control of the first and second dielectric layers 628a and 628b and first and second metal gate layer 630a and 630b to bottom source/drain region 112 at the bottom portion of the transistor 104 and the memory component 106 is that the operating voltage applied to top source/drain region 614 will reach the sharp edges 306a-c thereby sharing the operating voltage of the transistor 104. In some embodiments, the sharp edges 306a-c of the memory component 106 require less operating voltage than that of a flat surface to program (e.g., modify a logic state) of the memory component 106 (e.g., operating voltage at the sharp edges 306a-c is less than operating voltage at the top source/drain region 614). Another advantage is that the memory component 106 is fabricated along with the transistor 104 with common process steps and materials. For example, same material can be used for forming the first and second dielectric layer 628a and 628b, forming the first and second metal gate layer 630a and 630b and forming the bottom source/drain layer 614 of the transistor 104 and memory component 106.

FIGS. 7-14 respectively illustrates intermediate semiconductor structures formed in association with an example fabrication process for forming a resistive non-volatile memory structure 100 in accordance with some embodiments described herein. In this regard, the respective FIGS. 7-14 pictorially demonstrate a sequential flow of respective fabrication steps of the example fabrication process. Repetitive description of like elements shown in respective embodiments are omitted for sake of brevity. Repetitive description of material that can be used for the like elements (e.g., substrate 114 and 714) shown in FIGS. 1-6 are omitted for sake of brevity.

Figure 7:
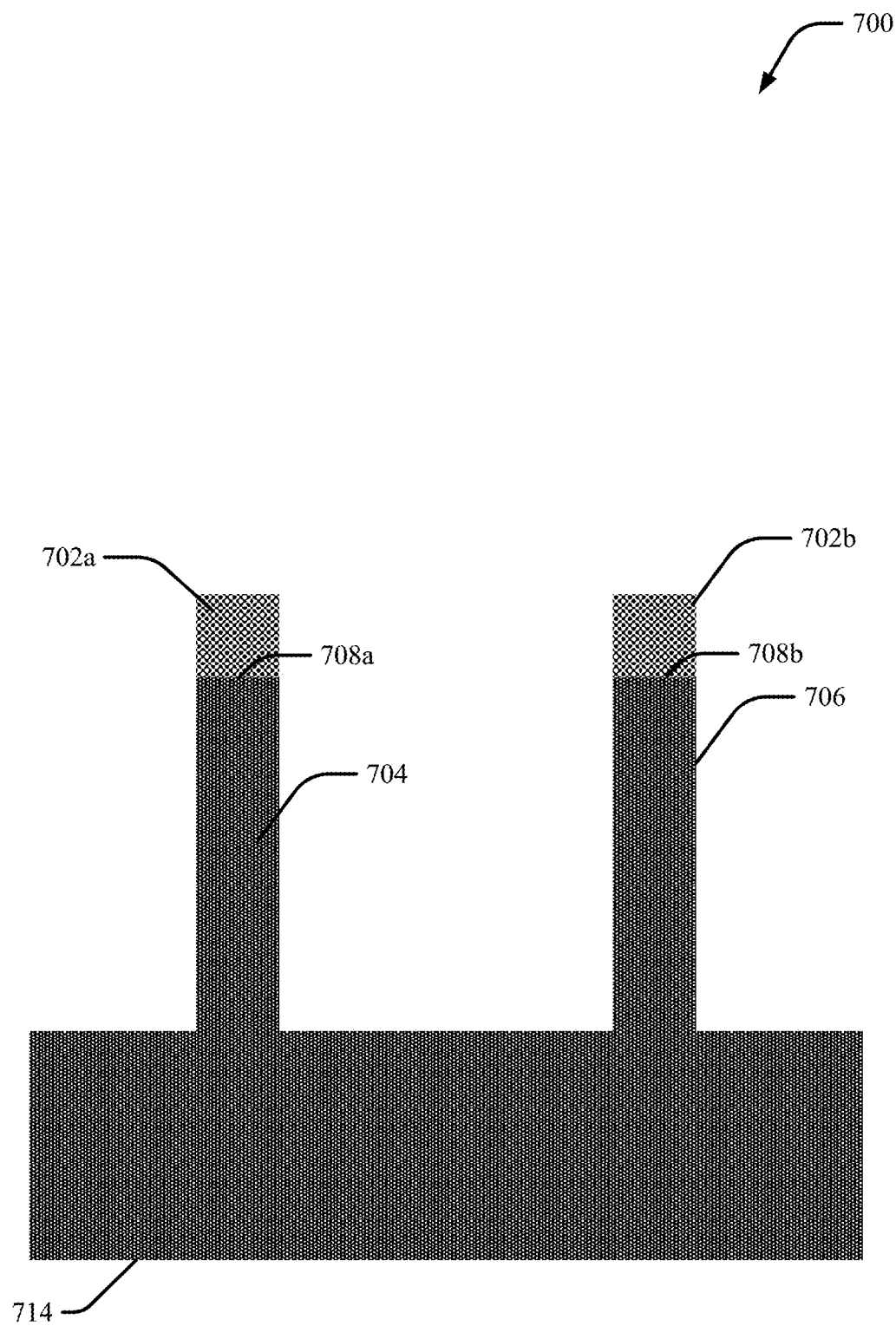
FIG. 7 an illustration of a, non-limiting starting structure for fabricating the resistive non-volatile memory structure in accordance with one or more embodiments is described herein.

FIG. 7 illustrates an example, non-limiting starting structure for fabricating the resistive non-volatile memory structure 700 in accordance with one or more embodiments is described herein. Repetitive description and label of like elements employed in respective embodiments are omitted for sake of brevity. According to one or more embodiments, start with the resistive non-volatile memory structure 700 that comprises a substrate 714. A transistor (a vertical field-effect transistor, e.g., VFET) 704 and a memory component (e.g., ReRAM) 706, both having a fin-like shape that extend upwardly from the substrate 714. The transistor 704 is capped by a hard mask 702a covering the top surface 708a of the transistor 704. The memory component 706 is capped by a hard mask 702b covering the top surface 708b of the transistor 704.

Figure 8:
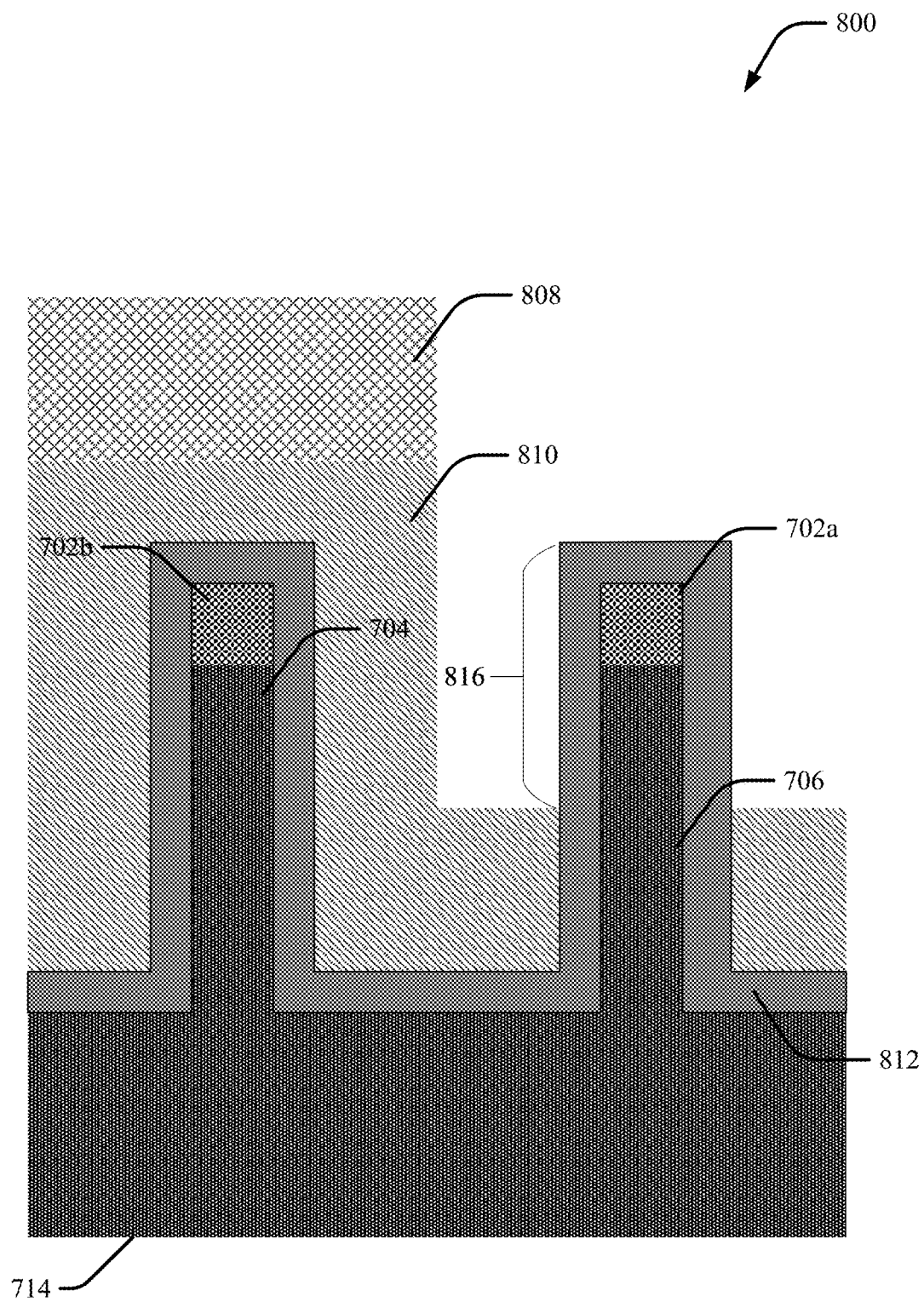
FIG. 8 illustrates an example, non-limiting step in fabricating the resistive non-volatile memory structure in accordance with one or more embodiments is described herein.

FIG. 8 illustrates an example, non-limiting step in fabricating the resistive non-volatile memory structure 800 in accordance with one or more embodiments is described herein. Repetitive description and label of like elements employed in respective embodiments are omitted for sake of brevity. According to one or more embodiments, the one or more steps can comprise forming a nitride layer 812 over the transistor 704, the memory component 706 and the substrate 714. In some embodiments, the one or more steps can comprise depositing an organic-planer layer (OPL) 810 covering the transistor 704 and partially covering the memory component 706. The one or more steps can comprise forming a mask layer 808 on top of the OPL 810 portion that covers the transistor 704. As depicted, a portion 816 of the memory component 706 remains exposed.

Figure 9:
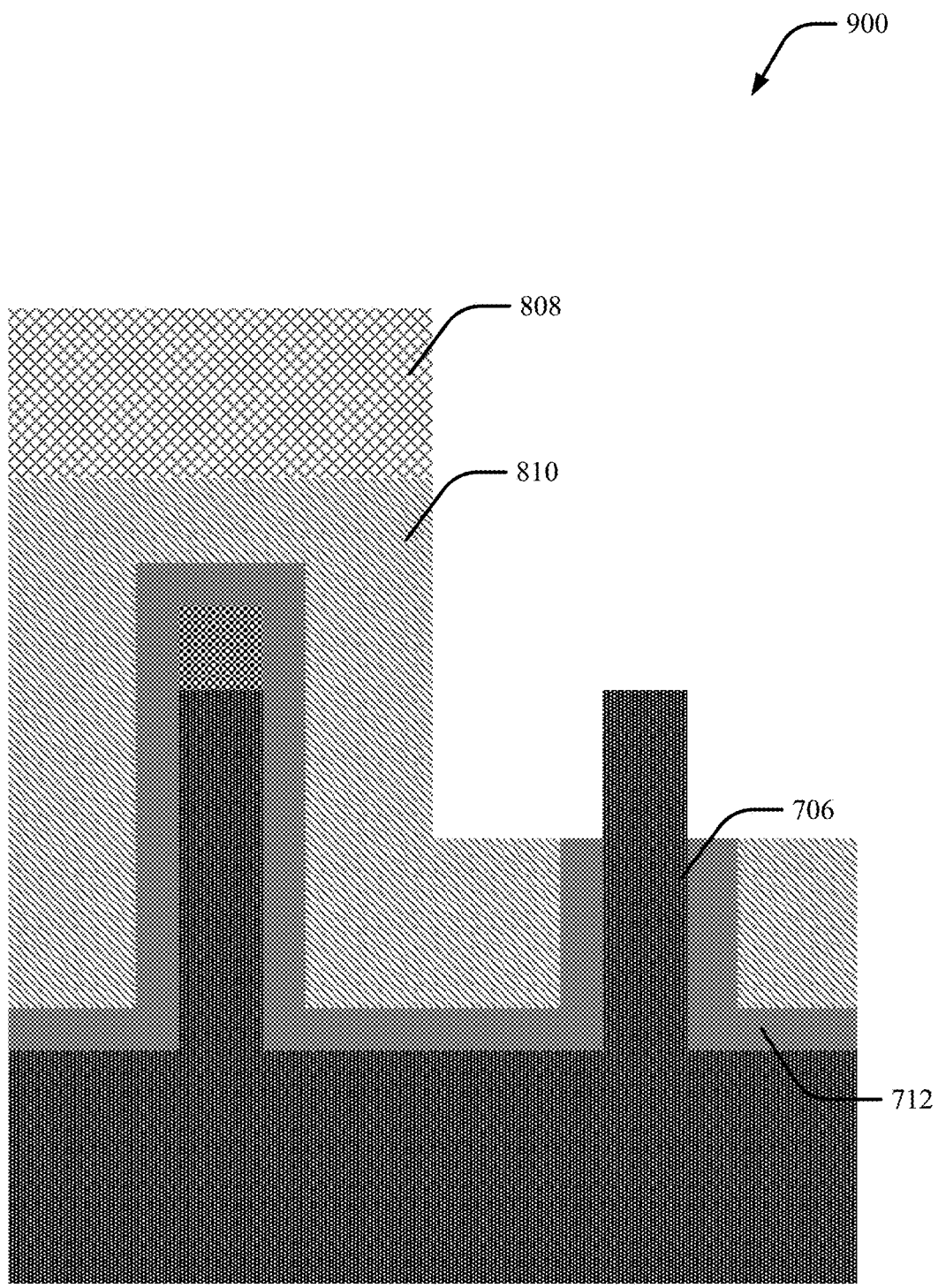
FIG. 9 illustrates an example, non-limiting step in fabricating the resistive non-volatile memory structure in accordance with one or more embodiments is described herein.

FIG. 9 illustrates an example, non-limiting step in fabricating the resistive non-volatile memory structure 900 in accordance with one or more embodiments is described herein. Repetitive description and label of like elements employed in respective embodiments are omitted for sake of brevity. According to one or more embodiments, the one or more steps can comprise removing portion of the nitride layer 812 that covered the memory component 706 and exposing the memory component 706.

Figure 10:
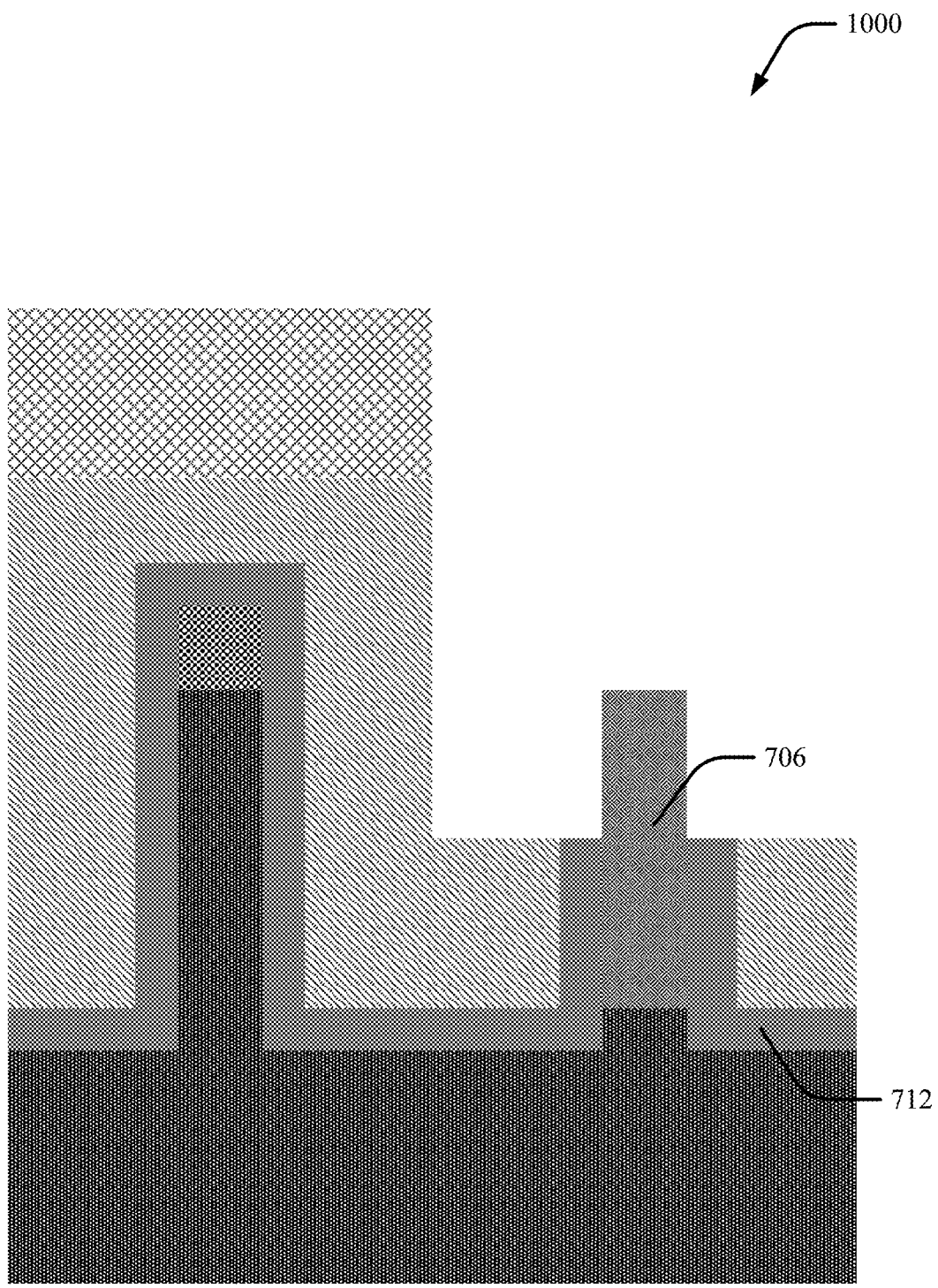
FIG. 10 illustrates an example, non-limiting step in fabricating the resistive non-volatile memory structure in accordance with one or more embodiments is described herein.

FIG. 10 illustrates an example, non-limiting step in fabricating the resistive non-volatile memory structure 1000 in accordance with one or more embodiments is described herein. Repetitive description and label of like elements employed in respective embodiments are omitted for sake of brevity. According to one or more embodiments, the silicon material is removed from the memory component 706 and the memory component 706 is doped with same material used for the bottom source/drain region 112 (FIG. 4) using the similar doping technique as discussed in FIG. 4.

Figure 11:
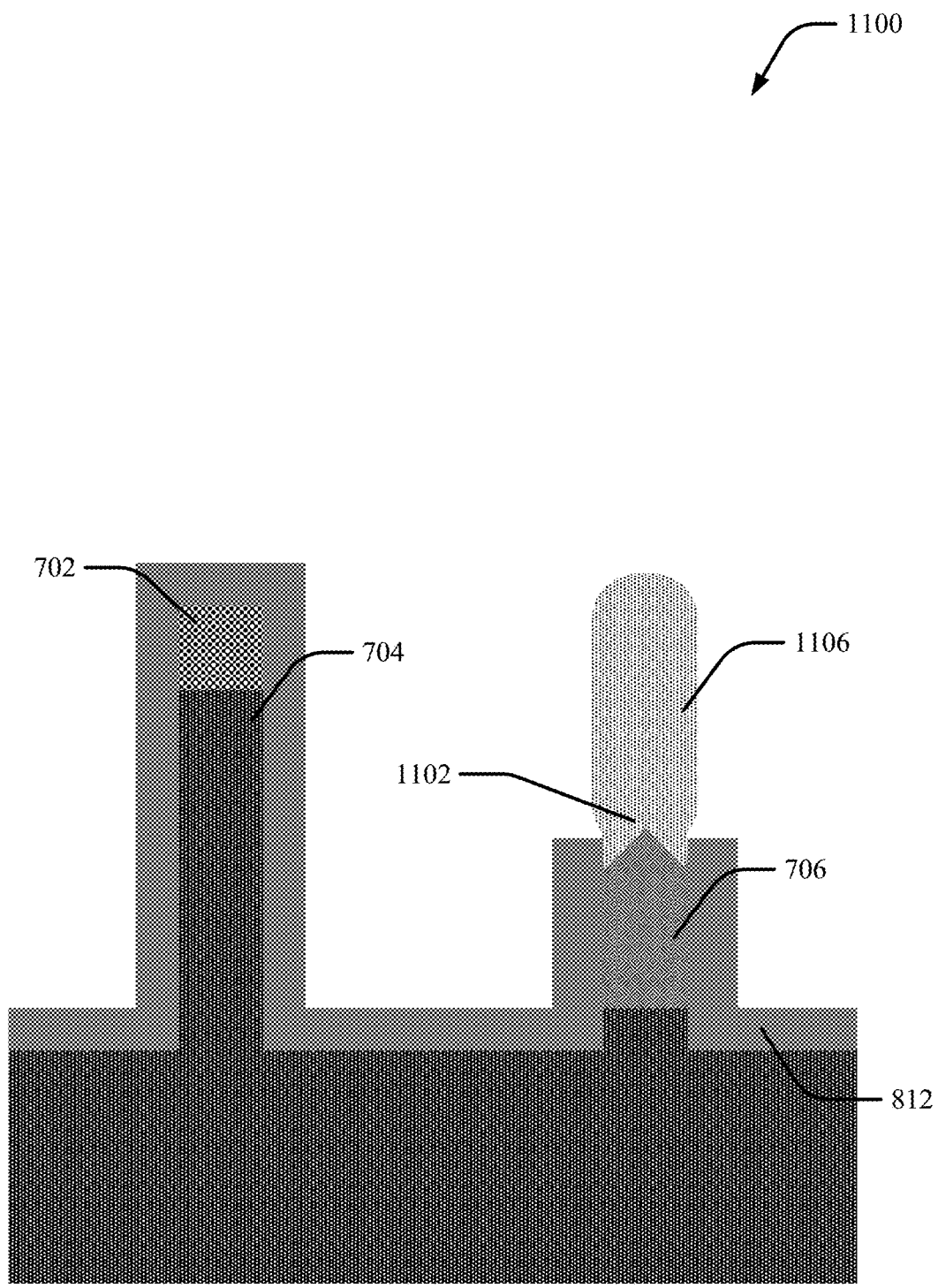
FIG. 11 illustrates an example, non-limiting step in fabricating the resistive non-volatile memory structure in accordance with one or more embodiments is described herein.

FIG. 11 illustrates an example, non-limiting step in fabricating the resistive non-volatile memory structure 1100 in accordance with one or more embodiments is described herein. Repetitive description and label of like elements employed in respective embodiments are omitted for sake of brevity. According to one or more embodiments, the one or more steps can comprise removing the mask layer 818 and the organic-planer layer 810. In an embodiment, the one or more steps can comprise converting the exposed portion 816 of the memory component 706 from semiconductor material (e.g., silicon) into oxide material 1106. An oxidization process [furnace oxidation, rapid thermal oxidation, plasma oxidation, etc. The oxidation can be performed in an environment containing oxidation species such as oxygen gas, water vapor, hydrogen gas mixed with oxygen gas, oxygen plasma. Inert gas such as nitrogen, helium, argon, and/or neon, can be added in the oxygen process. Oxidation temperature, pressure, duration can be tuned to oxidize different amount of the semiconductor fin. In some embodiments, the oxidation is performed in a wet oxidation condition with water vapor at a temperature between 500 C to 800 C for 5 minutes to 30 minutes. In other embodiments, the oxidation is performed by plasma oxidation in an oxygen plasma. In other embodiments, the oxidation is performed in dry oxidation condition with oxygen gas at 800 C to 1200 C for 0.1 second to 60 seconds. The process pressure can range from 0.1 Torr to 1500 Torr. Other suitable oxidation conditions are also conceived.]When the exposed silicon fin (e.g., the memory component 706) is being oxidized, a pointed edge 1102 is form on the memory component 706. The nitride 812 protects the rest of the structure from being oxidized. It should be noted that the pointy edge is formed by oxidizing the exposed silicon fin (e.g., memory component 706) into oxide.

Figure 12:
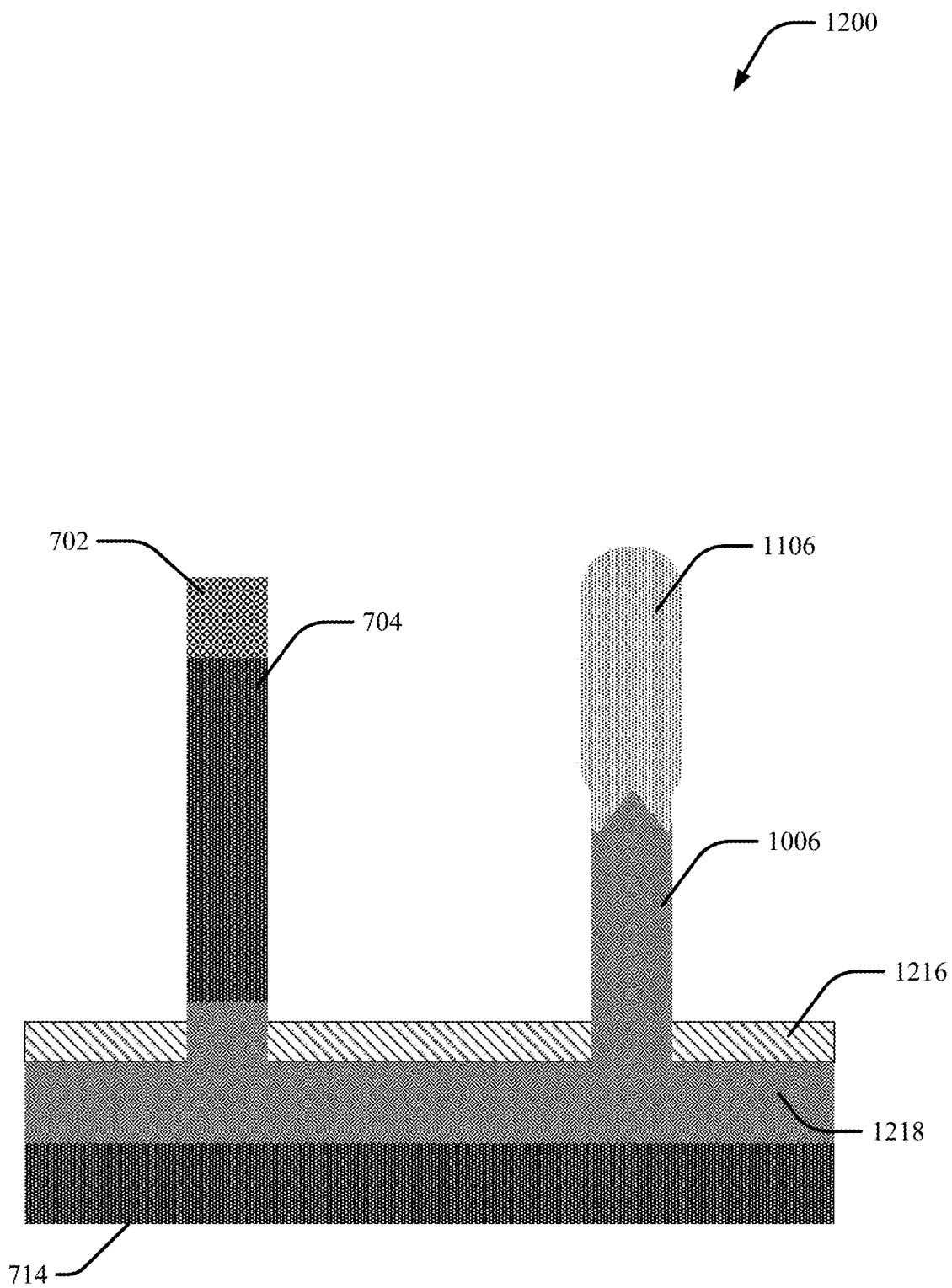
FIG. 12 illustrates an example, non-limiting step in fabricating the resistive non-volatile memory structure in accordance with one or more embodiments is described herein.

FIG. 12 illustrates an example, non-limiting step in fabricating the resistive non-volatile memory structure 1200 in accordance with one or more embodiments is described herein. Repetitive description and label of like elements employed in respective embodiments are omitted for sake of brevity. According to one or more embodiments, the one or more steps can comprise removing the nitride layer 812. Forming, at the lower portions of the transistor 704 and the memory component 706, a bottom source/drain region 1218 over the substrate 714. In an embodiment, the one or more steps can comprise forming a bottom spacer layer 1216 over the bottom source/drain region 1218.

Figure 13:
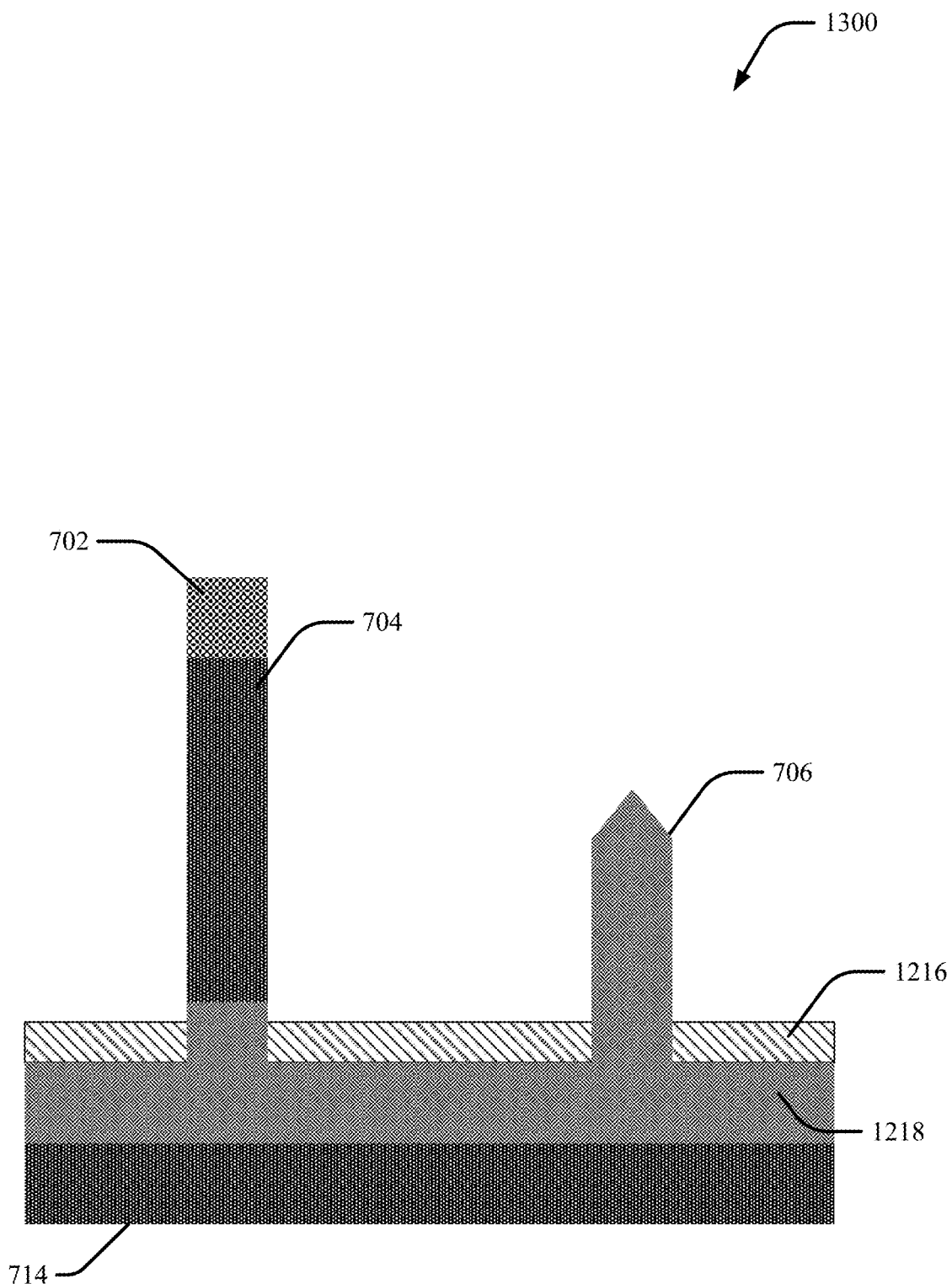
FIG. 13 illustrates an example, non-limiting step in fabricating the resistive non-volatile memory structure in accordance with one or more embodiments is described herein.

FIG. 13 illustrates an example, non-limiting step in fabricating the resistive non-volatile memory structure 1300 in accordance with one or more embodiments is described herein. Repetitive description and label of like elements employed in respective embodiments are omitted for sake of brevity. According to one or more embodiments, the one or more steps can comprise removing the oxide material 1006 from the memory component 706. In some embodiments, the oxide material 1006 can be removed before the formation of the bottom spacer.

Figure 14:
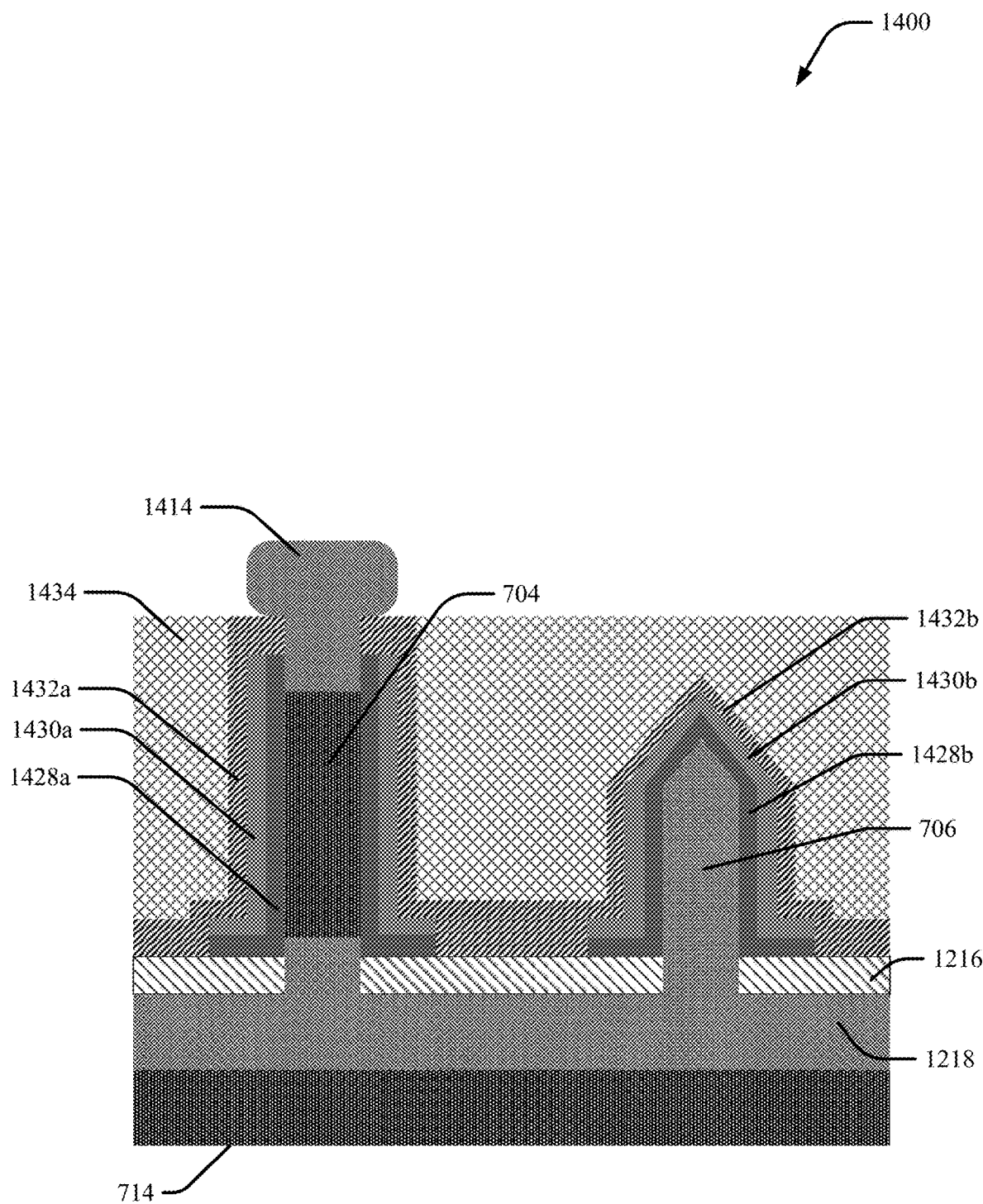
FIG. 14 illustrates an example, non-limiting step in fabricating the resistive non-volatile memory structure in accordance with one or more embodiments is described herein.

FIG. 14 illustrates an example, non-limiting step in fabricating the resistive non-volatile memory structure 1400 in accordance with one or more embodiments is described herein. Repetitive description and label of like elements employed in respective embodiments are omitted for sake of brevity. Repetitive description of material that can be used for the like elements (e.g., first and second dielectric layers 628a and 628b) shown in FIG. 6 are omitted for sake of brevity.

According to one or more embodiments, a first dielectric layer 1428a is formed over the transistor 704 such that a portion of the first dielectric layer 1428a is electrically coupled to bottom source/drain region 1218. In some embodiments, a second dielectric layer 1428b is formed over the memory component 706 such that a portion of the second dielectric layer 1428b is electrically coupled to bottom source/drain region 1218 at the bottom portion of the memory component 706 and bottom portion of the transistor 704. In some embodiment a first metal gate layer 1430a is formed over the first dielectric layer 1428a and a second metal gate layer 1430b is formed over the second dielectric layer 1428b. In some embodiments, a first top spacer layer 1432a is formed over the first metal gate layer 1430a and a second top spacer layer 1432b is formed over the second metal gate layer 1430b. In some embodiments, an inter-level dielectric (ILD) 1434 is deposited over both the transistor 704 and the memory component 706 and covering up to the top surface 708a of the transistor 704. Upon form the above layers, the hard mask 702a is removed and replaced with a top source/drain region 1414. In an embodiment, the top source/drain region 1414 is formed, for example, by epitaxy growth.

In some embodiments, the first and second dielectric layers 1428a and the second 1428b can comprise a high-x dielectric or transition metal oxide such as nickel oxide, tantalum oxide, titanium oxide, hafnium oxide, tungsten oxide, zirconium oxide, aluminum oxide, strontium titanate, and combinations thereof. The high-k dielectric can be deposited, for example, by conformal deposition processes include, but are not limited to, chemical vapor deposition (CVD), or atomic layer deposition (ALD).

In some embodiments, the first metal gate layer 1430a and the second metal gate layer 1430b can comprise any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO2), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material may further comprise dopants that are incorporated during or after deposition. In some embodiments, the metal gate layer 1430a may comprise a work function setting layer (not shown) between the gate dielectric (e.g. first and second dielectric layer 1428a and 1428b) and gate conductor (e.g., first and second metal gate layer 1430a and 1430b). The work function setting layer can be a work function metal (WFM). The WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

In some embodiments, the first top spacer 1432a and second top spacer 1432b can comprise silicon nitride, silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), or any suitable combination of those materials.

In some embodiments, the top source/drain 1414 can be formed from an in-situ doped (i.e., during growth) epitaxial material such as in-situ doped epitaxial Si, carbon doped silicon (Si:C) and/or SiGe. Suitable n-type dopants include but are not limited to phosphorous (P), and suitable p-type dopants include but are not limited to boron (B). The use of an in-situ doping process is merely an example. For instance, one may instead employ an ex-situ process to introduce dopants into the source and drains. In should be noted that other doping techniques can be used to incorporate dopants in the bottom source/drain region 712. Dopant techniques can include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques. In some embodiments, the high-k dielectric (e.g., second dielectric layer 1428b) can serve as a memristor element sandwiched between two electrodes (e.g., the second metal gate layer 1430b and the memory component 706). To render the memory component 706 (e.g., resistive memory element) functional, defects (e.g., oxygen vacancies) are intentionally introduced in the memristor film by applying a voltage across the second dielectric layer 1428b. Different states such as a low-resistance state (logic "1") or a high-resistance state (logic "0") can be achieved by changing the polarity of electrical field across the second dielectric layer 1428b.

In some embodiments, electrical contacts (not shown) can be formed on the top source/drain 1414, on first metal gate layer 1430a of the transistor 704, and on top of second dielectric layer 1430b of the memory component 706, can be formed by any suitable processing such as deposition, patterning, metallization.

Figure 15:
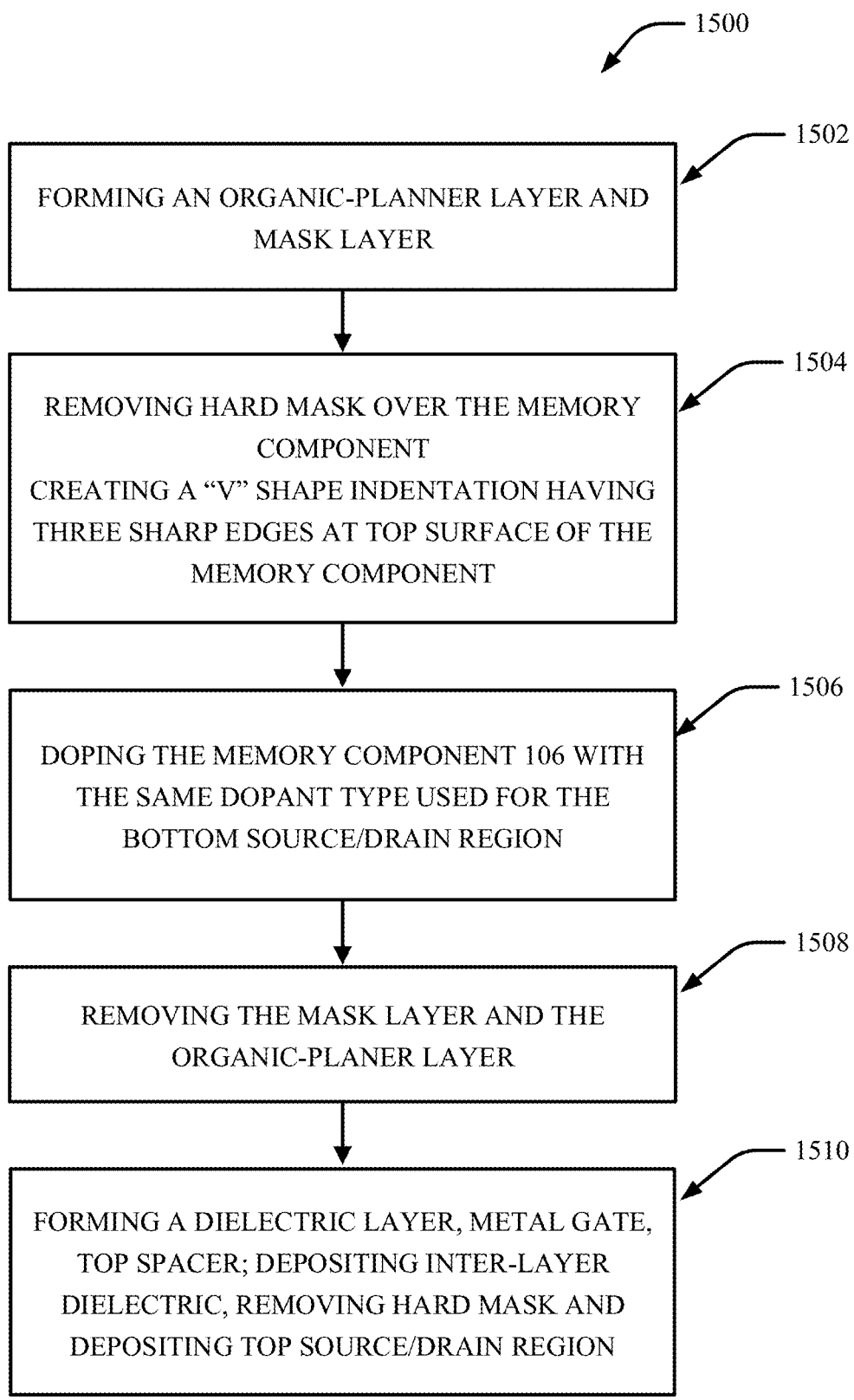
FIG. 15 illustrates a flow diagram of an example, non-limiting method of forming the resistive non-volatile memory structure in accordance with one or more embodiments described herein

FIG. 15 illustrates a flow diagram of an example, non-limiting method 1500 of forming the resistive non-volatile memory structure 600 in accordance with one or more embodiments described herein. At block 1502, a starting point, using the resistive non-volatile memory structure 100, forming the organic-planer layer 212 and the mask layer 214. Then at block 1504, removing hard mask 102b over the memory component 106 and creating a "V" shape indentation (e.g., "V" shaped groove) having three sharp edges 306a-c at the top surface 108b of the memory component 106 (e.g., forming a faceted edge on a top surface 108b of the memory component 106, wherein the faceted edge comprises a plurality of pointed edges). Then at block, doping the memory component 106 with the same dopant type used for the bottom source/drain region 112. Then at block 1508, removing the mask layer 214 and the organic-planer layer 212. Then at block 1510, finalizing the structure by forming a dielectric layer 628 over both the transistor 104 and the memory component 106, forming a metal gate layer 630 over the dielectric layer 628, forming a top spacer layer 632 over the metal gate layer 630, depositing inter-layer dielectric material 634, removing hard mask 102a and depositing the top source/drain region 614 on top surface 108a of the transistor 104.

Figure 16:
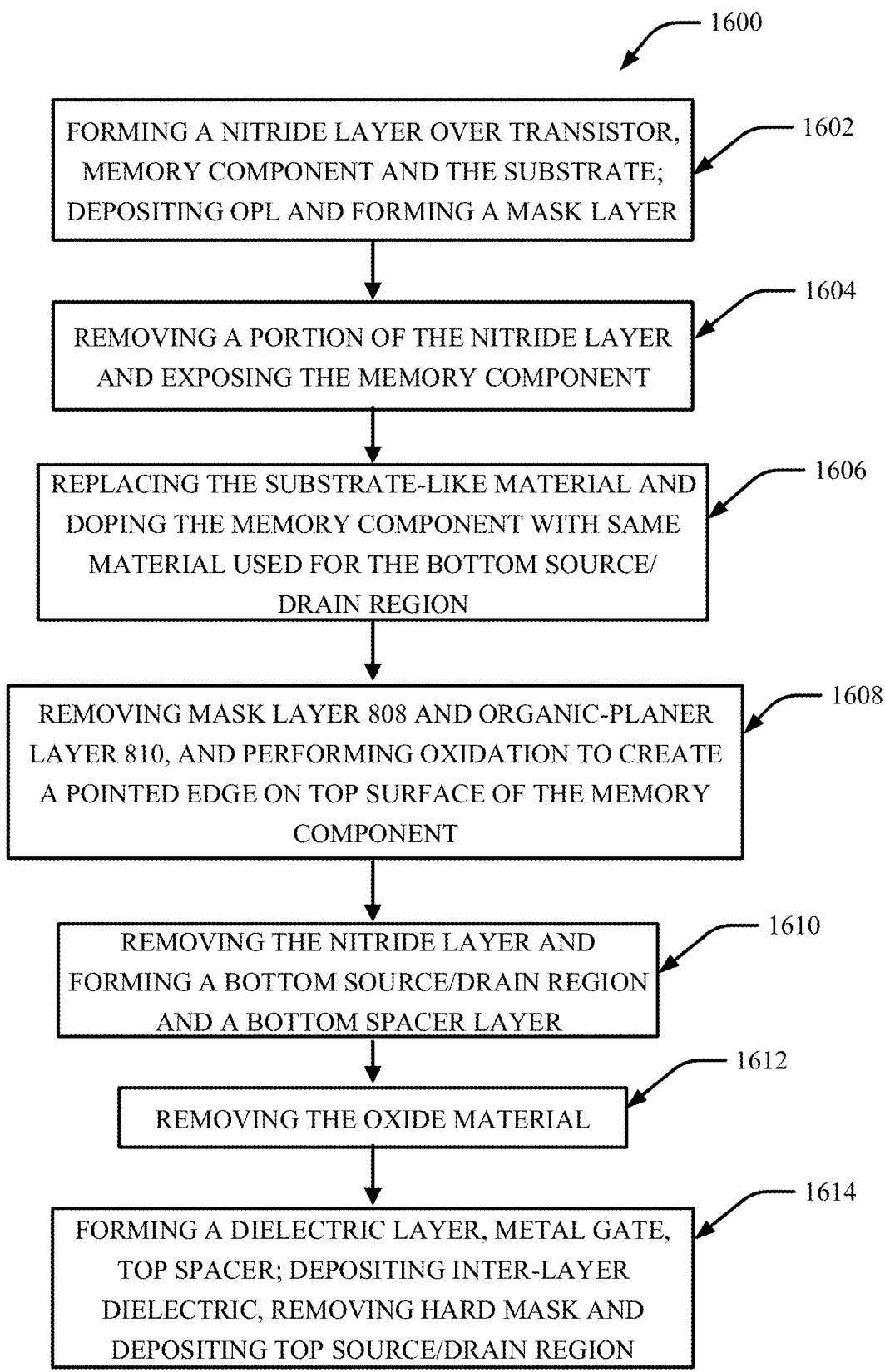
FIG. 16 illustrates a flow diagram of an example, non-limiting method of forming the resistive non-volatile memory structure in accordance with one or more embodiments described herein

FIG. 16 illustrates a flow diagram of an example, non-limiting method 1600 of forming the resistive non-volatile memory structure 1400 in accordance with one or more embodiments described herein. At block 1602, the one or more steps can comprise, as a starting point, using the resistive non-volatile memory structure 700, forming the nitride layer 812 over the transistor 704, memory component 706 and the substrate 714. In addition, the one or more steps can comprise depositing the organic-planer layer 810 and forming a mask layer 808 over the transistor 704 portion. Then at block 1604, the one or more steps can comprise removing a portion of the nitride layer 812 covering the memory component 706. Then at block 1606, the one or more steps can comprise replacing the substrate-like material and doping the memory component 706 with similar material used for the bottom source/drain region 112 (FIG. 1). Then at block, the one or more steps can comprise removing mask layer 808 and organic-planer layer 810 and performing oxidation to create a pointed edge 1102 on top of the memory component 706 (e.g., forming one or more-pointed edges on a top surface 708b of memory component 706 employing the oxide material 1106). Then at block 1610, the one or more steps can comprise removing the nitride layer 812, forming the bottom source/drain region 1218, and the bottom spacer layer 1216. Then at block 1612, the one or more steps can comprise removing the oxide material 1106. Then at block 1514, the one or more steps can comprise finalizing the structure by forming a dielectric layer 1428 over both the transistor 704 and the memory component 706, forming a metal gate layer 1430 over the dielectric layer 1428, forming a top spacer layer 1432 over the metal gate layer 1430, depositing inter-layer dielectric material 1434, removing hard mask 702a and depositing the top source/drain region 1414 on top surface 708a of the transistor 704.

Figure 17:
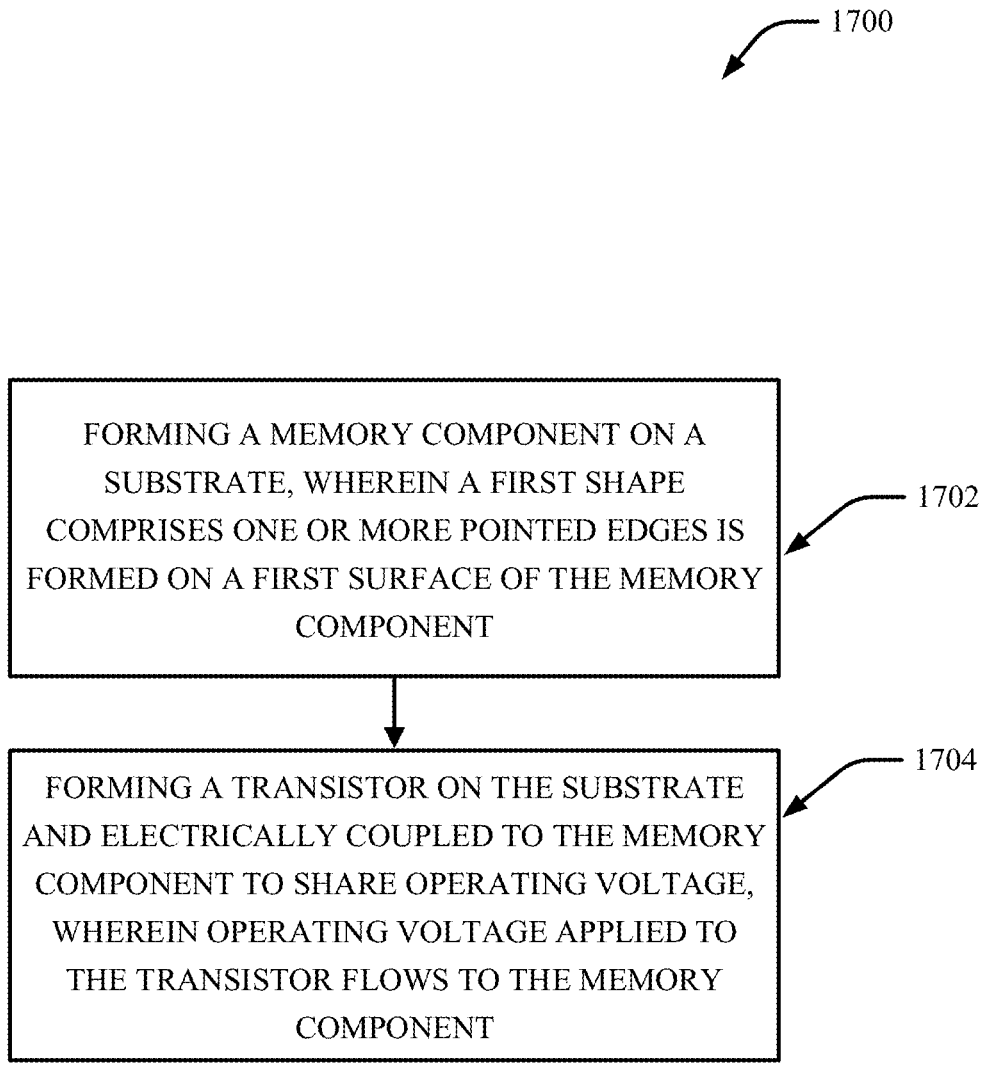
FIG. 17 illustrates a flow diagram of an example, non-limiting computer-implemented method that facilitates fabricating the resistive non-volatile memory structure in accordance with one or more embodiments described herein.

FIG. 17 illustrates a flow diagram of an example, non-limiting computer-implemented method that facilitates fabricating the resistive non-volatile memory structure 100 in accordance with one or more embodiments described herein. In some examples, flow diagram 1700 can be implemented by operating environment 1900. It can be appreciated that the operations of flow diagram 1700 can be implemented in a different order than is depicted. It can also be appreciated that the operations of flow diagram 1700 can be implemented in a different order than is depicted.

In non-limiting example embodiments, a computing device (or system) (e.g., computer 1912) is provided comprising one or more processors and one or more memories that stores executable instructions that, when executed by the one or more processors, can facilitate performance of the operations as described herein, including the non-limiting methods as illustrated in the flow diagrams of FIG. 17. As a non-limiting example, the one or more processors can facilitate performance of the methods by directing or controlling one or more equipment operable to perform semiconductor fabrication.

Operation 1702 depicts forming (e.g., by computer 1912) a memory component on a substrate, wherein a first shape comprises one or more pointed edges is formed on a first surface of the memory component. Operation 1704 depicts forming a transistor on the substrate and electrically coupled to the memory component to share operating voltage, wherein operating voltage applied to the transistor flows to the memory component.

Figure 18:
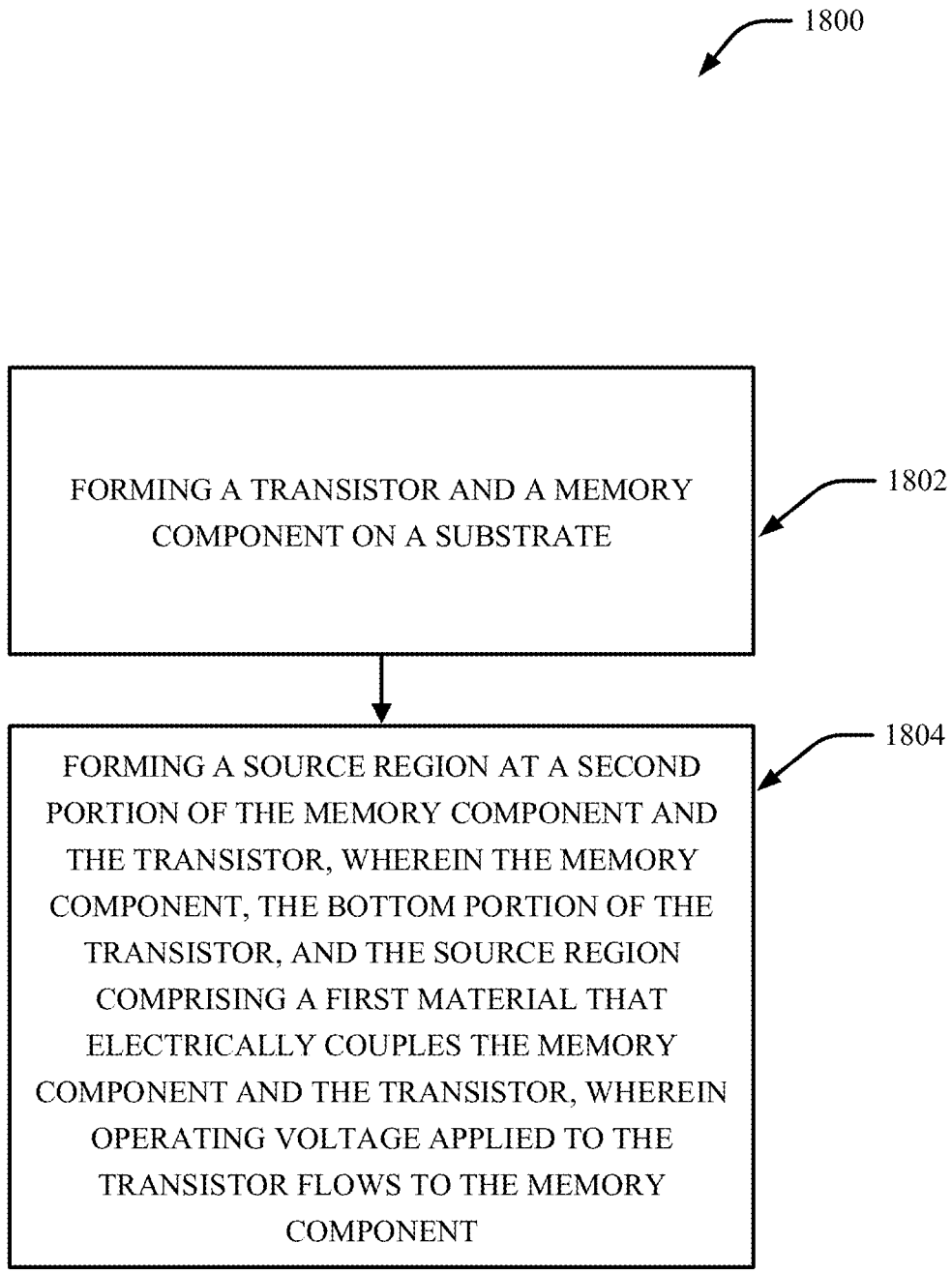
FIG. 18 illustrates a flow diagram of an example, non-limiting computer-implemented method that facilitates fabricating the resistive non-volatile memory structure in accordance with one or more embodiments described herein.

FIG. 18 illustrates a flow diagram of an example, non-limiting computer-implemented method that facilitates fabricating the resistive non-volatile memory structure 100 in accordance with one or more embodiments described herein. In some examples, flow diagram 1800 can be implemented by operating environment 1900. It can be appreciated that the operations of flow diagram 1800 can be implemented in a different order than is depicted. It can also be appreciated that the operations of flow diagram 1800 can be implemented in a different order than is depicted.

In non-limiting example embodiments, a computing device (or system) (e.g., computer 1912) is provided comprising one or more processors and one or more memories that stores executable instructions that, when executed by the one or more processors, can facilitate performance of the operations as described herein, including the non-limiting methods as illustrated in the flow diagrams of FIG. 18. As a non-limiting example, the one or more processors can facilitate performance of the methods by directing or controlling one or more equipment operable to perform semiconductor fabrication.

Operation 1802 depicts forming (e.g., by computer 1912) a transistor and a memory component on a substrate. Operation 1804 depicts forming a source region at a bottom portion of the memory component and the transistor, wherein the memory component, the bottom portion of the transistor, and the source region comprising a first material that electrically couples the memory component and the transistor, wherein operating voltage applied to the transistor flows to the memory component.

Figure 19:
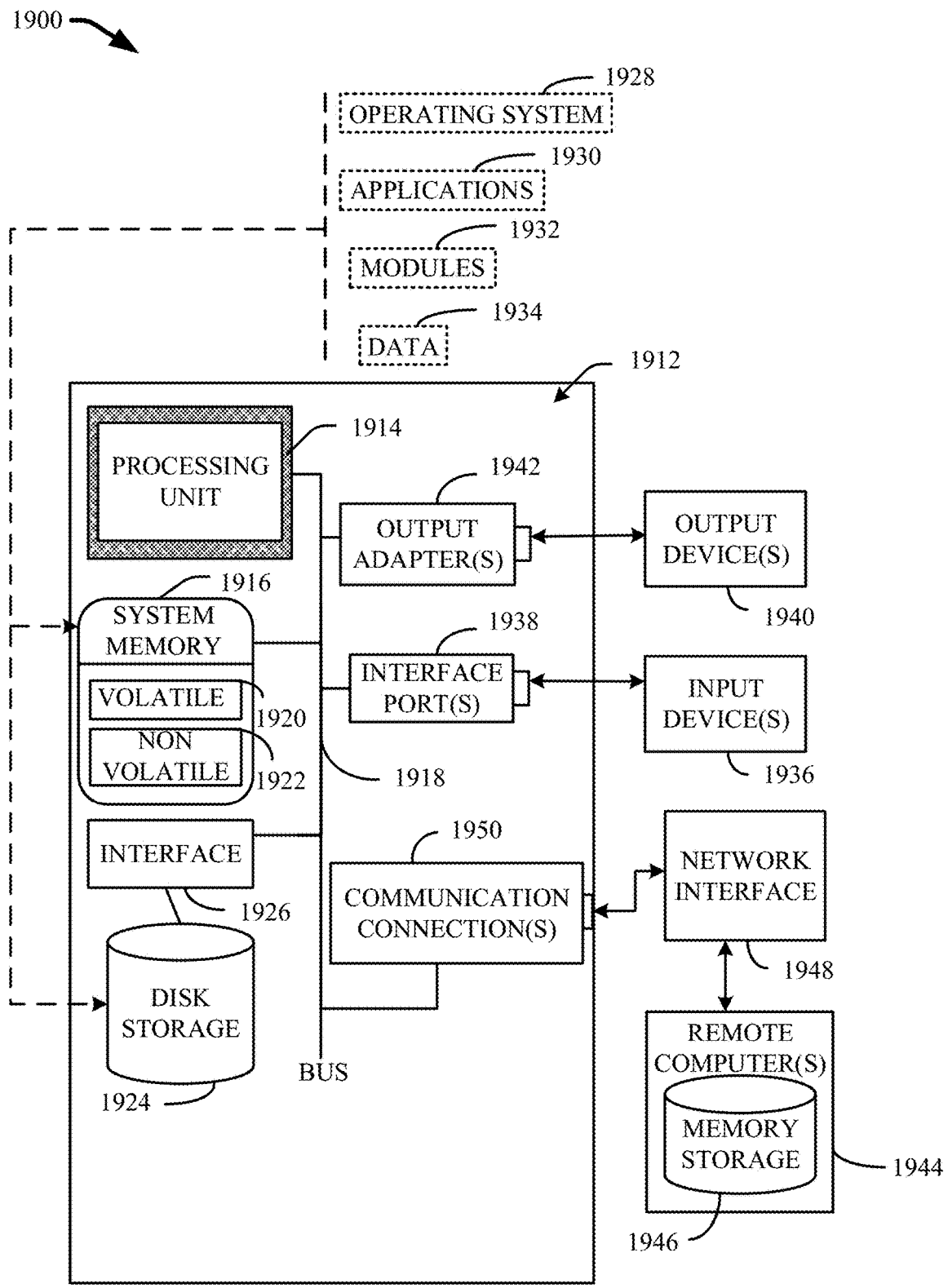
FIG. 19 illustrates a block diagram of an example, non-limiting operating environment in which one or more embodiments is described herein can be facilitated.

To provide context for the various aspects of the disclosed subject matter, FIG. 19 as well as the following discussion are intended to provide a general description of a suitable environment in which the various aspects of the disclosed subject matter can be implemented. FIG. 19 illustrates a block diagram of an example, non-limiting operating environment in which one or more embodiments described herein can be facilitated. Repetitive description of like elements employed in other embodiments described herein is omitted for sake of brevity.

A suitable operating environment 1900 for implementing various aspects of this disclosure can also include a computer 1912. The computer 1912 can also include a processing unit 1914, a system memory 1916, and a system bus 1918. The system bus 1918 couples system components including, but not limited to, the system memory 1916 to the processing unit 1914. The processing unit 1914 can be any of various available processors. Dual microprocessors and other multiprocessor architectures also can be employed as the processing unit 1914. The system bus 1918 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1994), and Small Computer Systems Interface (SCSI). The system memory 1916 can also include volatile memory 1920 and nonvolatile memory 1922. The basic input/output system (BIOS), containing the basic routines to transfer information between elements within the computer 1912, such as during start-up, is stored in nonvolatile memory 1922. By way of illustration, and not limitation, nonvolatile memory 1922 can include read only memory (ROM), programmable ROM (PROM), electrically programmable ROM (EPROM), electrically erasable programmable ROM (EEPROM), flash memory, or nonvolatile random-access memory (RAM) (e.g., ferroelectric RAM (FeRAM). Volatile memory 1920 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1912 can also include removable/non-removable, volatile/non-volatile computer storage media. FIG. 19 illustrates, for example, a disk storage 1924. Disk storage 1924 can also include, but is not limited to, devices like a magnetic disk drive, floppy disk drive, tape drive, Jaz drive, Zip drive, LS-100 drive, flash memory card, or memory stick. The disk storage 1924 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1924 to the system bus 1918, a removable or non-removable interface is typically used, such as interface 1926. FIG. 19 also depicts software that acts as an intermediary between users and the basic computer resources described in the suitable operating environment 1901. Such software can also include, for example, an operating system 1928. Operating system 1928, which can be stored on disk storage 1924, acts to control and allocate resources of the computer 1912. System applications 1930 take advantage of the management of resources by operating system 1928 through program modules 1932 and program data 1934, e.g., stored either in system memory 1916 or on disk storage 1924. It is to be appreciated that this disclosure can be implemented with various operating systems or combinations of operating systems. A user enters commands or information into the computer 1912 through input device(s) 1936. Input devices 1936 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1914 through the system bus 1918 via interface port(s) 1938. Interface port(s) 1938 include, for example, a serial port, a parallel port, a game port, and a universal serial bus (USB). Output device(s) 1940 use some of the same type of ports as input device(s) 1936. Thus, for example, a USB port can be used to provide input to computer 1912, and to output information from computer 1912 to an output device 1940. Output adapter 1942 is provided to illustrate that there are some output devices 1940 like monitors, speakers, and printers, among other output devices 1940, which require special adapters. The output adapters 1942 include, by way of illustration and not limitation, video and sound cards that provide a means of connection between the output device 1940 and the system bus 1918. It should be noted that other devices and/or systems of devices provide both input and output capabilities such as remote computer(s) 1944.

Computer 1912 can operate in a networked environment using logical connections to one or more remote computers, such as remote computer(s) 1944. The remote computer(s) 1944 can be a computer, a server, a router, a network PC, a workstation, a microprocessor-based appliance, a peer device or other common network node and the like, and typically can also include many or all the elements described relative to computer 1912. For purposes of brevity, only a memory storage device 1946 is illustrated with remote computer(s) 1944. Remote computer(s) 1944 is logically connected to computer 1912 through a network interface 1948 and then physically connected via communication connection 1950. Network interface 1948 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1950 refers to the hardware/software employed to connect the network interface 1948 to the system bus 1918. While communication connection 1950 is shown for illustrative clarity inside computer 1912, it can also be external to computer 1912. The hardware/software for connection to the network interface 1948 can also include, for exemplary purposes only, internal and external technologies such as, modems including regular telephone grade modems, cable modems and DSL modems, ISDN adapters, and Ethernet cards.

Embodiments of the present innovation may be a system, a method, an apparatus and/or a computer program product at any possible technical detail level of integration. The computer program product can include a computer readable storage medium (or media) having computer readable program instructions thereon for causing a processor to carry out aspects of the present innovation. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of various aspects of the present innovation can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to customize the electronic circuitry, to perform aspects of the present innovation.

Aspects of the present innovation are described herein with reference to flowchart illustrations and/or block diagrams of methods, apparatus (systems), and computer program products according to embodiments of the innovation. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present innovation. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that executes on a computer and/or computer, those skilled in the art will recognize that this disclosure also can or can be implemented in combination with other program modules. Generally, program modules include routines, programs, components, data structures, etc. that perform tasks and/or implement abstract data types. Moreover, those skilled in the art will appreciate that the inventive computer-implemented methods can be practiced with other computer system configurations, including single-processor or multiprocessor computer systems, minicomputing devices, mainframe computers, as well as also computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a server computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems, computer program products, and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    forming a memory component on a substrate, wherein a first shape comprises one or more pointed edges formed on a first surface of the memory component, wherein the one or more-pointed edges of the first shape are formed employing an oxide material; and
    forming a transistor on the substrate and electrically coupled to the memory component to share operating voltage, wherein the operating voltage applied to the transistor flows to the memory component.

2. The method of claim 1, further comprising:
    covering the memory component and the transistor with a dielectric layer.

3. The method of claim 1, further comprising:
covering the memory component and the transistor with a dielectric layer and
covering the dielectric layer with a metal gate.

4. The method of claim 1, further comprising:
forming a dielectric layer that covers the memory component;
forming a metal gate that covers the dielectric layer; and
forming a top spacer layer that covers the metal gate.

5. The method of claim 1, further comprising:
forming a source region at a second portion of the memory component and the transistor, wherein the source region comprises a first material that electrically couples the memory component to the transistor.

6. The method of claim 5, wherein the first material comprises a semiconductor material selected from a group consisting of a silicon, an alloy, a germanium, a III-V compound semiconductor, and a II-IV semiconductor.

7. The method of claim 1, wherein the memory component is a resistive random-access memory component.

8. The method of claim 1, wherein the transistor is a vertical field-effect transistor.

9. A method, comprising:
forming a transistor and a memory component on a substrate;
forming a source region at a second portion of the memory component and the transistor, wherein the source region comprises a first material that electrically couples the memory component and the transistor, and wherein operating voltage applied to the transistor flows to the memory component; and
forming a dielectric layer that covers the memory component and the transistor.

10. The method of claim 9, further comprising:
forming one or more-pointed edges on a first surface of memory component employing an oxide material.

11. The method of claim 9, further comprising:
forming a metal gate that covers the dielectric layer.

12. The method of claim 11, further comprising:
forming a top spacer layer that covers the metal gate.

13. The method of claim 9, wherein the memory component is a resistive random-access memory component.

14. The method of claim 9, wherein the transistor is a vertical field-effect transistor.

15. The method of claim 9, wherein the first material comprises a semiconductor material selected from a group consisting of a silicon, an alloy, a germanium, a III-V compound semiconductor, and a II-IV semiconductor.

16. A device, comprising:
a memory component formed on a substrate, wherein a first shape comprising one or more pointed edges is formed on a first top surface of the memory component, wherein the one or more-pointed edges of the first shape are formed comprising an oxide material; and
a transistor formed on the substrate and electrically coupled to the memory component to share operating voltage, wherein the operating voltage applied to the transistor flows to the memory component.

17. The device of claim 16, further comprising:
a dielectric layer that covers the memory component and the transistor.

18. The device of claim 16, further comprising:
a dielectric layer that covers the memory component and the transistor; and
a metal gate that covers the dielectric layer.

19. The device of claim 16, wherein the memory component is a resistive random-access memory component.

20. The device of claim 16, wherein the transistor is a vertical field-effect transistor.

* * * * *